United States Patent
Nishiyama et al.

(10) Patent No.: US 7,326,516 B2
(45) Date of Patent: Feb. 5, 2008

(54) RESIST COMPOSITION FOR IMMERSION EXPOSURE AND PATTERN FORMATION METHOD USING THE SAME

(75) Inventors: Fumiyuki Nishiyama, Shizuoka (JP); Hyou Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/050,721

(22) Filed: Feb. 7, 2005

(65) Prior Publication Data
US 2005/0186503 A1    Aug. 25, 2005

(30) Foreign Application Priority Data
Feb. 20, 2004  (JP) .............................. 2004-044795

(51) Int. Cl.
*G03F 7/004*  (2006.01)
*G03F 7/00*   (2006.01)

(52) U.S. Cl. ................................. 430/270.1

(58) Field of Classification Search ............... None
See application file for complete search history.

(56) References Cited

U.S. PATENT DOCUMENTS

| | | | |
|---|---|---|---|
| 6,787,282 B2 * | 9/2004 | Sato | 430/170 |
| 7,056,646 B1 * | 6/2006 | Amblard et al. | 430/311 |
| 2001/0008739 A1 | 7/2001 | Nishiyama et al. | |
| 2004/0009429 A1 | 1/2004 | Sato | |
| 2004/0110085 A1 | 6/2004 | Iwai et al. | |
| 2004/0119954 A1 * | 6/2004 | Kawashima et al. | 355/30 |
| 2005/0019690 A1 * | 1/2005 | Kodama | 430/270.1 |
| 2005/0095535 A1 * | 5/2005 | Iwai et al. | 430/270.1 |

FOREIGN PATENT DOCUMENTS

| | | |
|---|---|---|
| EP | 1 096 319 A | 5/2001 |
| EP | 1 193 556 A1 | 4/2002 |
| EP | 1 338 921 A | 8/2003 |
| EP | 1 491 951 A | 12/2004 |
| EP | 1 519 228 A2 | 3/2005 |
| EP | 1 522 891 A1 | 4/2005 |
| EP | 1 536 285 A2 | 6/2005 |
| EP | 1 589 375 A1 | 10/2005 |
| JP | 57-153433 A | 9/1982 |
| JP | 7-220990 A | 8/1995 |
| JP | 10-303114 A | 11/1998 |
| WO | WO 03/048861 A1 | 6/2003 |

OTHER PUBLICATIONS

"Semiconductor Foundry, Litography, and Partners", B. J. Lin, SPIE, vol. 4688, 2002, pp. 11-24.
"Liquid immersion deep-ultraviolet interferometric lithography", J. A. Hoffnagle, et al., J. Vac. Sci. Technol., B 17 (6), Nov./Dec. 1999, pp. 3306-3309.
Sato M., "TOK Resist & Material Development Status for Immersion Lithography", Jan. 24, 2004, Retrieved from the Internet: URL:http://www.sematech.org/resources/litho/meetings/>.

* cited by examiner

*Primary Examiner*—Amanda C. Walke
(74) *Attorney, Agent, or Firm*—Sughrue Mion, Pllc.

(57) ABSTRACT

A resist composition for immersion, comprises: (A) a resin of which solubility in an alkali developer increases under an action of an acid; (B) a photoacid generator; and (C) a mixed solvent containing an alkylene glycol alkyl ether carboxylate and a propylene glycol monomethyl ether.

9 Claims, No Drawings

RESIST COMPOSITION FOR IMMERSION EXPOSURE AND PATTERN FORMATION METHOD USING THE SAME

BACKGROUND OF THE INVENTION

1. Field of the Invention

The present invention relates to a resist composition for use in the step of producing a semiconductor such as IC, in the production of a circuit board for liquid crystal, thermal head and the like, and in the lithography step of other photofabrication processes, and also relates to a pattern formation method using the composition. More specifically, the present invention relates to a resist composition suitable for exposure by an immersion-type projection exposure apparatus using a light source of emitting far ultraviolet light at a wavelength of 300 nm or less, and a pattern formation method using the composition.

2. Description of the Related Art

Along with the refinement of semiconductor devices, the trend is proceeding toward a short wavelength exposure light source and a high numerical aperture (high NA) projection lens. At present, exposure machines with NA of 0.84 have been developed, where an ArF excimer laser having a wavelength of 193 nm is used as the light source. As commonly well known, these can be expressed by the following formula:

(Resolving power)=$k_1 \cdot (\lambda/NA)$ (Depth of focus)=$\pm k_2 \cdot \lambda/AN^2$ wherein $\lambda$ is the wavelength of exposure light source, NA is the numerical aperture of projection lens, and $k_1$ and $k_2$ are constants related to the process.

In order to obtain shorter wavelength and higher resolving power, studies are being made on exposure machines where an $F_2$ excimer laser having a wavelength of 157 nm is used as the light source. However, the lens material used for the exposure apparatus and the material used for the resist so as to obtain shorter wavelength are very limited and therefore, it is very difficult to stabilize the production cost or quality of the apparatus and materials. This may lead to a failure in procuring the exposure apparatus and resist having sufficiently high performance and stability, within a required time period.

With regard to the technique of elevating the resolving power in optical microscopes, a so-called immersion method of filling a high refractive index liquid (hereinafter sometimes referred to as an "immersion liquid") between the projection lens and the sample has been conventionally known.

As for the "effect of immersion", assuming that $\lambda_0$ denotes the wavelength of exposure light in air, n denotes the refractive index of immersion liquid to air and $\theta$ denotes the convergence half-angle and that $NA_0$=sin $\theta$, the above-described resolving power and depth of focus when immersed can be expressed by the following formulae:

(Resolving power)=$k_1 \cdot (\lambda_0/n)/NA_0$ (Depth of focus)=$\pm k_2 \cdot (\lambda_0/n)/NA_0^2$ That is, the effect of immersion is equal to use of an exposure wavelength of 1/n. In other words, in the case of a projection optical system of the same NA, the depth of focus can be made n times larger by the immersion. This is effective for all pattern profiles and furthermore, can be combined with super-resolution techniques being studied at present, such as phase-shift method and modified illumination method.

Examples of the apparatus applying this effect to the transfer of a fine pattern of semiconductor devices include those described in JP-A-57-153433 and JP-A-7-220990, but these are not discussing on the resist suitable for immersion exposure techniques.

JP-A-10-303114 indicates that the control of refractive index of the immersion liquid is important because changes in the refractive index of immersion liquid bring about deterioration of the projected image due to difference in the wave front aberration of exposing machine, and discloses to control the temperature coefficient of refractive index of the immersion liquid to a certain range or use, as a suitable immersion liquid, water where the surface tension is decreased or an additive of increasing the surface activity is added. However, the additive is not disclosed or the resist suitable for immersion exposure techniques is not discussed.

Recent progress of immersion exposure techniques is reported, for example, in Proceedings of Society of Photo-Optical Instrumentation Engineers (Proc. SPIE), Vol. 4688, page 11 (2002) and J. Vac. Sci. Tecnol. B, 17 (1999). In the case of using an ArF excimer laser as the light source, in view of safety on handling and transmittance and refractive index at 193 nm, pure water (refractive index at 193 nm: 1.44) is considered most promising as the immersion liquid. In the case of using an F2 excimer laser as the light source, a fluorine-containing solution is being studied in the light of balance between transmittance and refractive index at 157 nm, but those satisfied from the aspect of environmental safety or in the refractive index have been not yet found out. The immersion exposure technique is considered to be most soon mounted on an ArF exposing machine in view of the degree of immersion effect and the maturity of resist.

Since the discovery of the resist for KrF excimer laser (248 nm), an image formation method called chemical amplification is used as the image formation method for the resist so as to compensate the reduction of sensitivity due to light absorption. To describe this by taking as an example the image formation method using positive chemical amplification, an acid generator in the exposed area decomposes upon exposure to generate an acid, the acid generated is used as a reaction catalyst in the post-exposure baking (PEB) to convert the alkali-insoluble group into an alkali-soluble group, and the exposed area is removed by alkali development.

In the immersion exposure, the resist film is exposed through a photomask in the state of an immersion liquid being filled between the resist film and the optical lens, and thereby the pattern of the photomask is transferred to the resist film. It is estimated that the immersion liquid permeates into the inside of the resist film and affects the chemical reaction (e.g., acid catalyst-type deprotection reaction, development reaction) brought about inside the resist during or after exposure. However, its degree of effect or mechanism is not yet elucidated.

When a chemical amplification resist is applied to the immersion exposure technique, the acid on the resist surface generated upon exposure moves to the immersion liquid and the acid concentration on the surface of exposed area is changed. This may be considered to have a close resemblance to the acid deactivation occurring on the surface of exposed area due to basic contamination in a very small amount on the order of several ppb mingled from the environment at the post-exposure time delay (PED), which is a serious problem at the initiation of development of the chemical amplification-type positive resist, but the effect of immersion exposure on the resist or the mechanism is not clearly known. When a chemical amplification-type resist causing no problem in the lithography by normal exposure is exposed by the immersion method, there arises a problem that the depth of focus (hereinafter sometimes referred to as "DOF") as a tolerance for focus fluctuation and the profile are deteriorated.

SUMMARY OF THE INVENTION

By taking account of these problems in the related-art techniques, an object of the present invention is to provide a resist composition for immersion exposure, which is free of deterioration of DOF and profile properties even when applied to immersion exposure, and provide a pattern formation method using the composition.

The present invention provides a resist composition for immersion exposure having the following constitutions and a pattern formation method using the composition and by these composition and method, the above-described object of the present invention is achieved.

1. A resist composition for immersion exposure, comprising:
   (A) a resin of which solubility in an alkali developer increases under an action of an acid,
   (B) a photoacid generator, and
   (C) a mixed solvent containing an alkylene glycol alkyl ether carboxylate and a propylene glycol monomethyl ether.

2. The resist composition for immersion exposure as described in 1 above, wherein the mixing ratio of the mixed solvent (C) is alkylene glycol alkyl ether carboxylate/propylene glycol monomethyl ether=4/6 to 9/1.

3. A pattern formation method comprising a step of coating the resist composition described in 1 or 2 above on a substrate to form a resist film, and a step of performing immersion exposure.

DETAILED DESCRIPTION OF THE INVENTION

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[Resist Composition]

In the step of performing resist pattern formation by using the immersion water of the present invention, the resist composition used (hereinafter sometimes referred to as "a resist composition for wet exposure") is not particularly limited, but a positive resist containing (A) an acryl/methacryl polymer capable of decomposing under an action of an acid to increase the solubility in an alkali developer is preferably used. The acryl/methacryl polymer as used in the present invention means a polymer where all repeating units constituting the polymer are constituted only by an acryl unit which may have an arbitrary substituent or by a methacryl unit which may have an arbitrary substituent.

As for the constituent components contained in the resist composition for wet exposure, in addition to the above-described polymer of (A), the composition may contain, for example, (B) a compound of generating an acid upon irradiation with an actinic ray or radiation, (C) a solvent, (D) a basic compound, (E) a fluorine-containing surfactant and/or a silicon-containing surfactant, (F) a dissolution inhibiting compound having a molecular weight of 3,000 or less and capable of decomposing under an action of an acid to increase the solubility in an alkali developer, (G) an alkali-soluble resin, and (H) an onium carboxylate. Each material is described in detail below.

(A) Resin Capable of Decomposing Under an Action of an Acid to Increase the Solubility in an Alkali Developer The resin used in the chemical amplification-type resist composition for immersion exposure of the present invention is a resin capable of decomposing under the action of an acid to increase the solubility in an alkali developer (acid-decomposable resin), and this resin has a group capable of decomposing under the action of an acid to generate an alkali-soluble group (hereinafter sometimes referred to as an "acid-decomposable group"), in the main or side chain or both the main and side chains of the resin. Incidentally, the resist composition of the present invention can be suitably used particularly for ArF immersion exposure.

Examples of the alkali-soluble group include a carboxyl group, a hydroxyl group and a sulfonic acid group.

The acid-decomposable group is preferably a group after displacing the hydrogen atom of a —COOH group with a group which splits off under the action of an acid.

Preferred examples of the acid-decomposable group include a cumyl ester group, an enol ester group, an acetal ester group and a tertiary alkyl ester group. Among these, a tertiary alkyl ester group is more preferred.

The resin capable of decomposing under the action of an acid to increase the solubility in an alkali developer, for use in the chemical amplification-type resist composition for immersion exposure of the present invention, is preferably a resin having a monocyclic or polycyclic alicyclic hydrocarbon structure.

Examples of the monocyclic or polycyclic alicyclic hydrocarbon structure include those in the repeating units having an alicyclic hydrocarbon-containing partial structure represented by formulae (pI) to (pVI) shown later, and those in the repeating unit represented by formula (II-AB).

The resin capable of decomposing under the action of an acid to increase the solubility in an alkali developer and having a monocyclic or polycyclic alicyclic hydrocarbon structure (hereinafter sometimes referred to as "an alicyclic hydrocarbon-based acid-decomposable resin"), contained in the chemical amplification-type resist composition for immersion exposure of the present invention, is preferably a resin having at least one member selected from the repeating units having an alicyclic hydrocarbon-containing partial structure represented by the following formulae (pI) to (pVI) and the repeating unit represented by the following formula (II-AB).

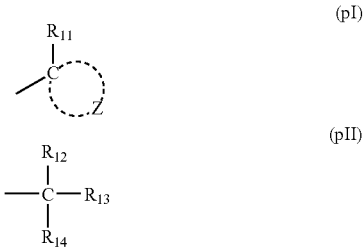

-continued

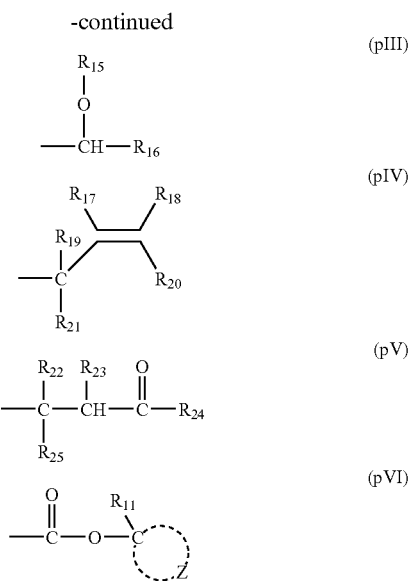

(pIII)

(pIV)

(pV)

(pVI)

wherein $R_{17}$ represents a methyl group, an ethyl group, an n-propyl group, an isopropyl group, an n-butyl group, an isobutyl group or a sec-butyl group, Z represents an atomic group necessary for forming an alicyclic hydrocarbon group together with the carbon atom, $R_{12}$ to $R_{16}$ each independently represents a linear or branched alkyl group having from 1 to 4 carbon atoms or an alicyclic hydrocarbon group, provided that at least one of $R_{12}$ to $R_{14}$ or either one of $R_{15}$ and $R_{16}$ represents an alicyclic hydrocarbon group, $R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group, $R_{22}$ to $R_{25}$ each independently represents a hydrogen atom, a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group represented by $R_{12}$ to $R_{25}$ is a linear or branched alkyl group having from 1 to 4 carbon atoms, such as methyl group, ethyl group, n-propyl group, isopropyl group, n-butyl group, isobutyl group, sec-butyl group and tert-butyl group.

Examples of the substituent which the alkyl group may have include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The alicyclic hydrocarbon group represented by $R_{11}$ to $R_{25}$ and the alicyclic hydrocarbon group formed by Z and the carbon atom each may be monocyclic or polycyclic. Specific examples thereof include a group having 5 or more carbon atoms and having a monocyclic, bicyclic, tricyclic or tetracyclic structure. The number of carbon atoms in the group is preferably from 6 to 30, more preferably from 7 to 25. These alicyclic hydrocarbon groups each may have a substituent.

Among these alicyclic moieties, preferred are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent of the alicyclic hydrocarbon group include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably an alkyl group selected from the group consisting of a methyl group, an ethyl group, a propyl group and an isopropyl group. Examples of the alkoxy group include an alkoxy group having from 1 to 4 carbon atoms, such as methoxy group, ethoxy group, propoxy group and butoxy group. Examples of the substituent which the alkyl group, alkoxy group, alkoxycarbonyl group and the like may further have include a hydroxyl group, a halogen atom and an alkoxy group.

The structures represented by formulae (pI) to (pVI) each can be used for the protection of an alkali-soluble group in the resin. Examples of the alkali-soluble group include various groups known in this technical field.

Specific examples thereof include a carboxylic acid group, a sulfonic acid group, a phenol group and a thiol group. Among these, preferred are a carboxylic acid group and a sulfonic acid group.

Preferred examples of the alkali-soluble group protected by the structure represented by any one of formulae (pI) to (pVI) in the resin include structures where a hydrogen atom of a carboxyl group is substituted by the structure represented by any one of formulae (pI) to (pVI).

The repeating unit having an alkali-soluble group protected by the structure represented by any one of formulae (pI) to (pVI) is preferably a repeating unit represented by the following formula (pA):

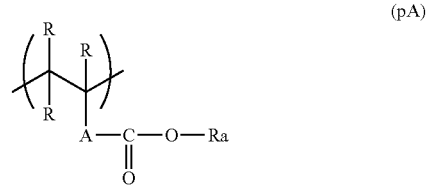

(pA)

wherein R represents a hydrogen atom, a halogen atom or a linear or branched alkyl group having from 1 to 4 carbon atoms, and multiple Rs may be the same or different;

A represents a single bond, or a sole group or a combination of two or more groups, selected from the group consisting of an alkylene group, an ether group, a thioether group, a carbonyl group, an ester group, an amido group, a sulfonamido group, a urethane group and a urea group; and Ra represents any one group of formulae (pI) to (pVI).

The repeating unit represented by formula (pA) is most preferably a repeating unit comprising a 2-alkyl-2-adamantyl (meth)acrylate or a dialkyl(1-adamantyl)methyl (meth) acrylate.

Specific examples of the repeating unit represented by formula (pA) are set forth below.

1
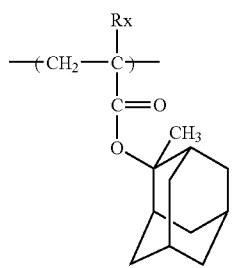
2
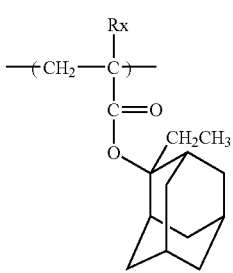
3
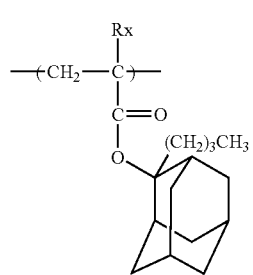
4
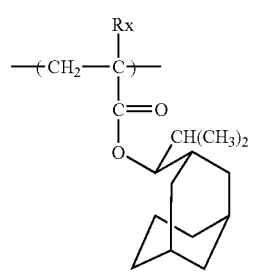
5
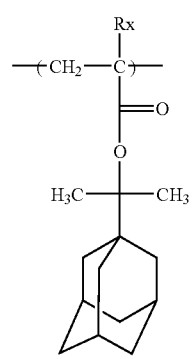
-continued
6
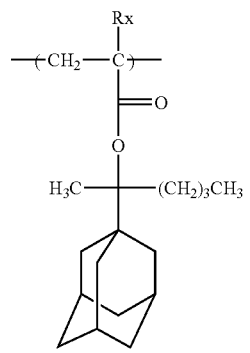
7
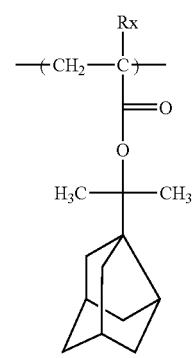
8
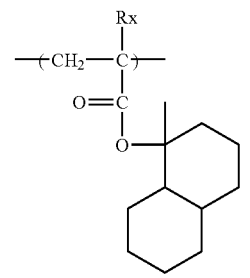
9
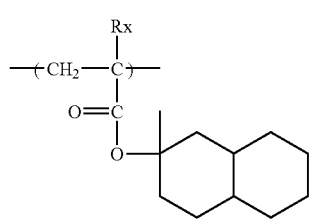
10
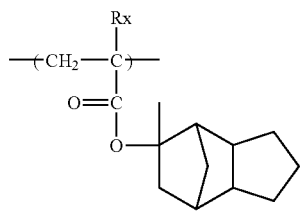
11
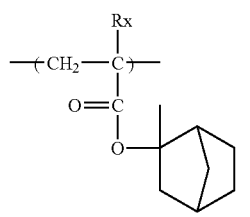

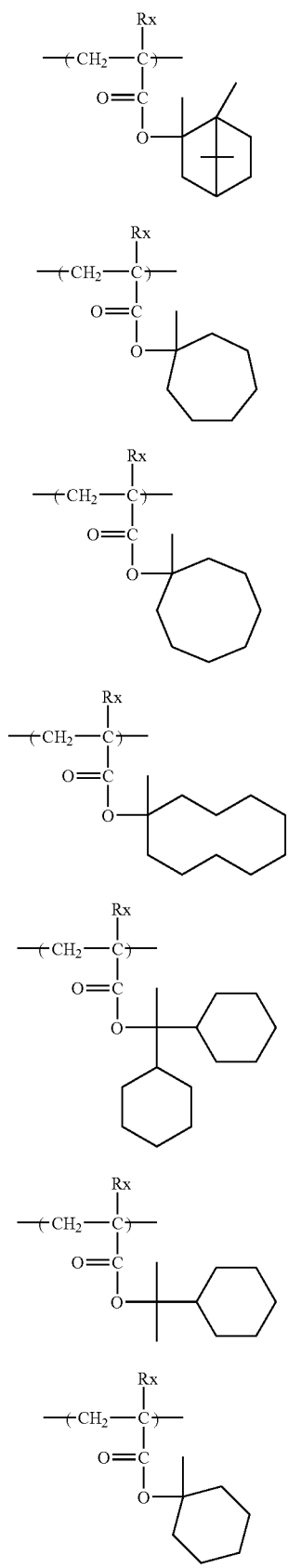
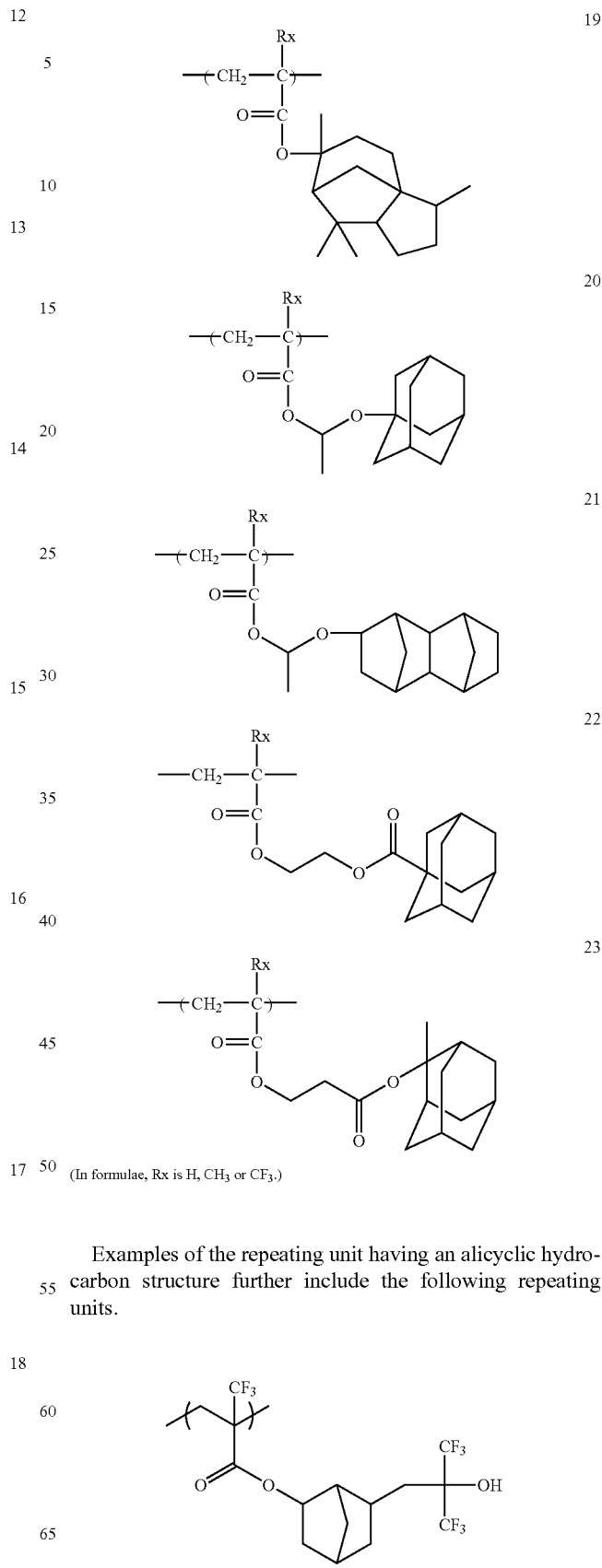
(In formulae, Rx is H, CH₃ or CF₃.)
Examples of the repeating unit having an alicyclic hydrocarbon structure further include the following repeating units.
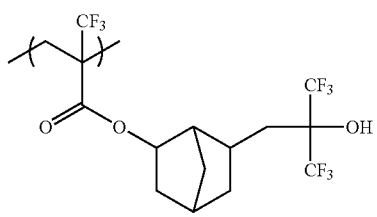

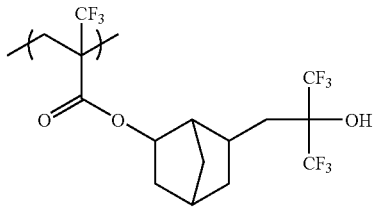

The repeating unit represented by formula (II-AB) is shown below:

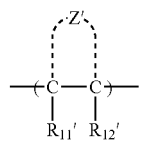
(II-AB)

wherein $R_{11}'$ and $R_{12}'$ each independently represents a hydrogen atom, a cyano group, a halogen atom or an alkyl group, and Z' represents an atomic group for forming an alicyclic structure containing two bonded carbon atoms (C—C).

Formula (II-AB) is preferably the following formula (II-A) or (II-B):

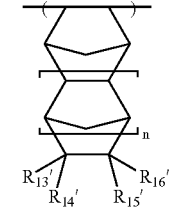
(II-A)

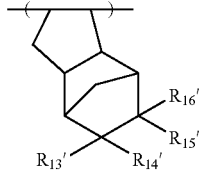
(II-B)

wherein $R_{13}'$ to $R_{16}'$ each independently represents a hydrogen atom, a halogen atom, a cyano group, —COOH, —COOR$_5$, a group of decomposing under the action of an acid, —C(=O)—X-A'-R$_{17}'$, an alkyl group or a cyclic hydrocarbon group, R$_5$ represents an alkyl group, a cyclic hydrocarbon group or a —Y group shown below, X represents an oxygen atom, a sulfur atom, —NH—, —NHSO$_2$— or —NHSO$_2$NH—, A' represents a sing bond or a divalent linking group, at least two of $R_{13}'$ to $R_{16}'$ may combine to form a ring, n represents 0 or 1, $R_{17}'$ represents —COOH, —COOR$_5$, —CN, a hydroxyl group, an alkoxy group, —CO—NH—R$_6$, —CO—NH—SO$_2$—R$_6$ or a —Y group shown below, and $R_6$ represents an alkyl or cyclic hydrocarbon group: —Y group:

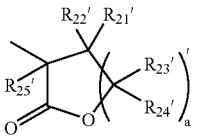 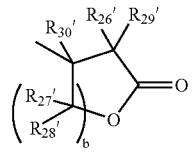

wherein $R_{21}'$ to $R_{30}'$ each independently represents a hydrogen atom or an alkyl group, and a and b each represents 1 or 2.

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, a n-butyl group, an isobutyl group, a sec-butyl group or a tert-butyl group.

Examples of the substituent which the alkyl group may further have include a hydroxyl group, a halogen atom, a carboxyl group, an alkoxy group, an acyl group, a cyano group and an acyloxy group. Examples of the halogen atom include a chlorine atom, a bromine atom, a fluorine atom and an iodine atom, examples of the alkoxy group include an alkoxy group having from 1 to 4 carbon atoms, such as methoxy group, ethoxy group, propoxy group and butoxy group, examples of the acyl group include a formyl group and an acetyl group, and examples of the acyloxy group include an acetoxy group.

The atomic group for forming an alicyclic structure, represented by Z', is an atomic group for forming a repeating unit of alicyclic hydrocarbon which may have a substituent, in the resin and among these atomic groups, preferred are an atomic group for forming a crosslinked alicyclic structure to form a crosslinked alicyclic hydrocarbon repeating unit.

Examples of the skeleton of alicyclic hydrocarbon formed are the same as those of the alicyclic hydrocarbon group of $R_{11}$ to $R_{25}$ in formulae (pI) to (pVI).

The alicyclic hydrocarbon skeleton may have a substituent and examples of the substituent include $R_{13}'$ to $R_{16}'$ in formulae (II-A) and (II-B).

Among the repeating units having a crosslinked alicyclic hydrocarbon, the repeating units represented by formulae (II-A) and (II-B) are more preferred.

In the alicyclic hydrocarbon-based acid-decomposable resin for use in the present invention, the acid-decomposable group may be contained in the —C(=O)—X-A'-R$_{17}'$ or may be contained as a substituent of Z' in formula (II-AB).

The structure of the acid-decomposable group is represented by —C(=O)—X$_1$—R$_0$.

In this formula, R$_0$ represents a tertiary alkyl group such as tert-butyl group and tert-amyl group, a 1-alkoxyethyl group such as isoboronyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilylester group, a 3-oxocyclohexylester group, a 2-methyl-2-adamantyl group, a mevalonic lactone residue or the like, and X$_1$ has the same meaning as X above.

Examples of the halogen atom of $R_{13}'$ to $R_{16}'$ include a chlorine atom, a bromine atom, a fluorine atom and an iodine atom.

The alkyl group of $R_5$, $R_6$, $R_{13}'$ to $R_{16}'$ and $R_{21}'$ to $R_{30}'$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, a n-butyl group, an isobutyl group, a sec-butyl group or a tert-butyl group.

The cyclic hydrocarbon group of $R_5$, $R_6$ and $R_{13}'$ to $R_{16}'$ is, for example, a cyclic alkyl group or a crosslinked hydrocarbon and examples thereof include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

The ring formed by combining at least two of $R_{13}'$ to $R_{16}'$ includes a ring having from 5 to 12 carbon atoms, such as cyclopentene, cyclohexene, cycloheptane and cyclooctane.

The alkoxy group of $R_{17}'$ includes an alkoxy group having from 1 to 4 carbon atoms, such as methoxy group, ethoxy group, propoxy group and butoxy group.

Examples of the substituent which the alkyl group, cyclic hydrocarbon group and alkoxy group may further have include a hydroxyl group, a halogen atom, a carboxyl group, an alkoxy group, an acyl group, a cyano group, an acyloxy group, an alkyl group and a cyclic hydrocarbon group. Examples of the halogen atom include a chlorine atom, a bromine atom, a fluorine atom and an iodine atom, examples of the alkoxy group include an alkoxy group having from 1 to 4 carbon atoms, such as methoxy group, ethoxy group, propoxy group and butoxy group, examples of the acyl group include a formyl group and an acetyl group, and examples of the acyloxy group include an acetoxy group.

Examples of the alkyl group and cyclic hydrocarbon group include those described above.

The divalent linking group of A' includes a sole group or a combination of two or more groups, selected from the group consisting of an alkylene group, an ether group, a thioether group, a carbonyl group, an ester group, an amido group, a sulfonamido group, a urethane group and a urea group.

In the alicyclic hydrocarbon-based acid-decomposable resin for use in the present invention, the group of decomposing under the action of an acid may be contained in at least one repeating unit out of the repeating units having an alicyclic hydrocarbon-containing partial structure represented by formulae (pI) to (pVI), the repeating unit represented by formula (II-AB), and the repeating unit of a copolymerization component which is described later.

Various substituents $R_{13}'$ to $R_{16}'$ in formulae (II-A) and (II-B) work out to the substituents of an atomic group for forming an alicyclic structure in formula (II-AB) or an atomic group Z for forming a crosslinked alicyclic structure.

Specific examples of the repeating units represented by formulae (II-A) and (II-B) are set forth below, but the present invention is not limited to these specific examples.

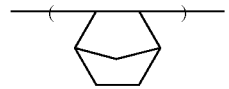

[II-1]

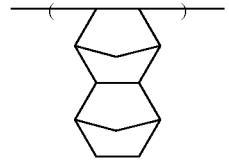

[II-2]

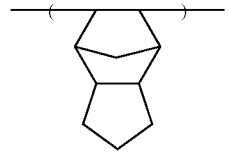

[II-3]

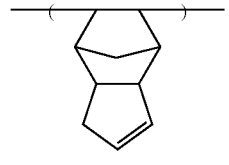

[II-4]

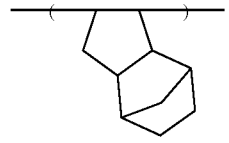

[II-5]

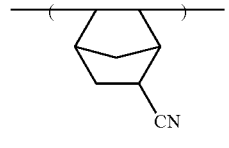

[II-6]

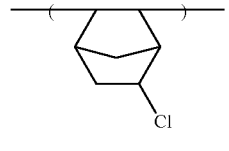

[II-7]

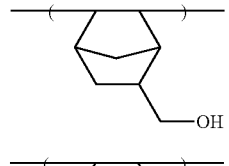

[II-8]

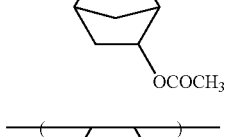

[II-9]

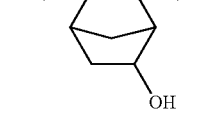

[II-10]

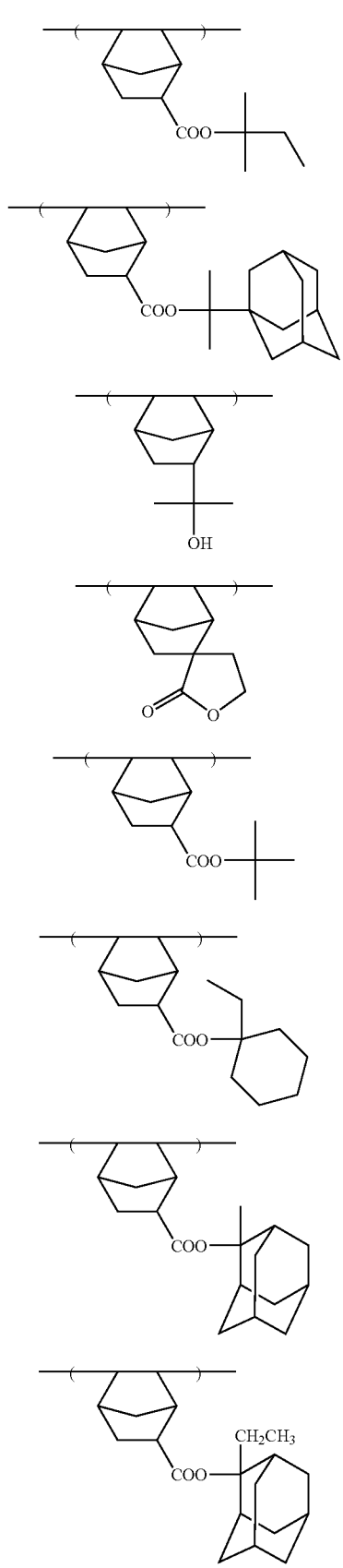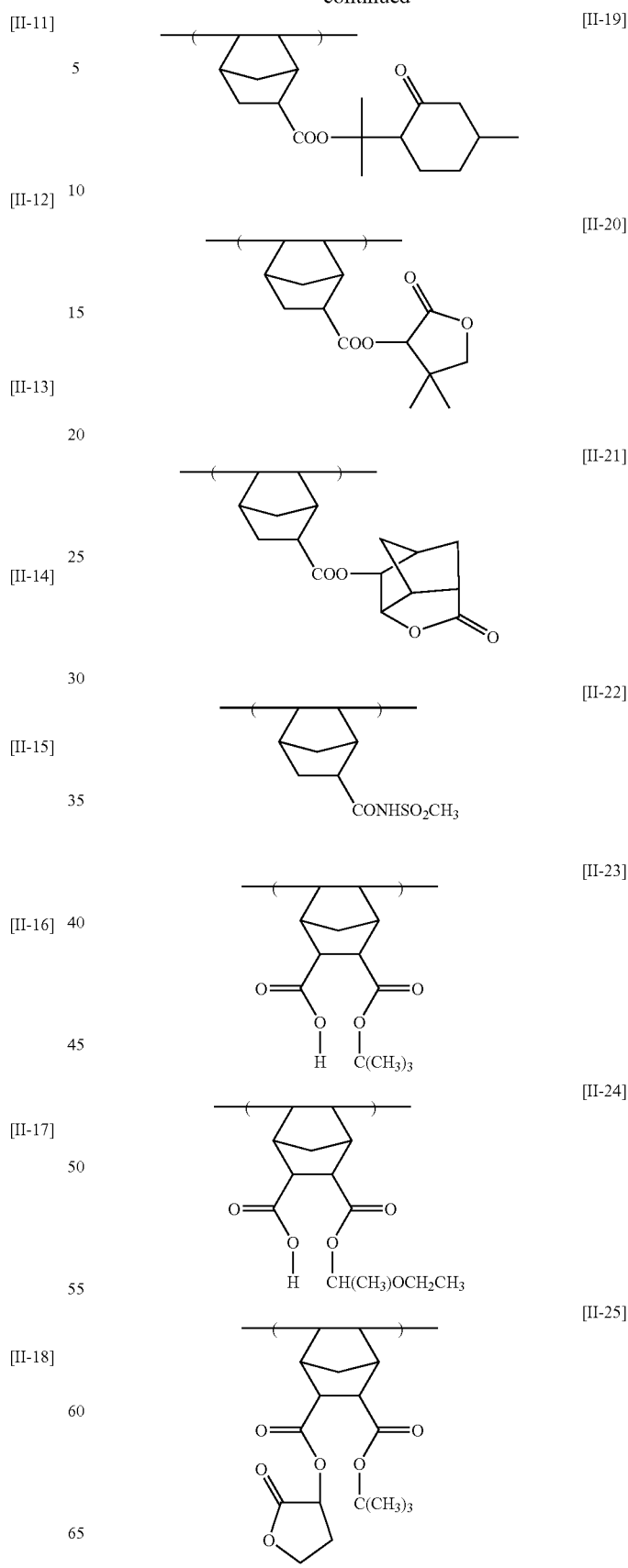

-continued

[II-26] 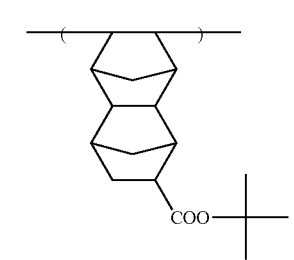

[II-27] 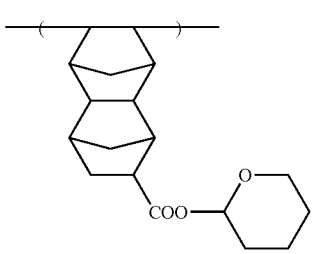

[II-28] 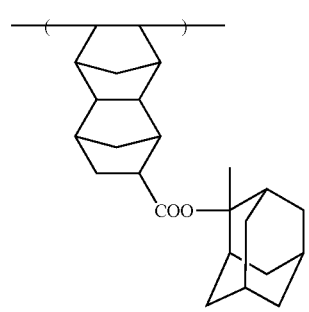

[II-29] 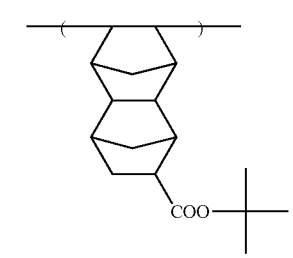

[II-30] 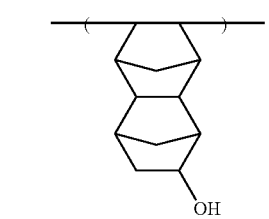

[II-31] 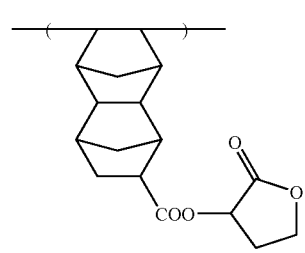

-continued

[II-32] 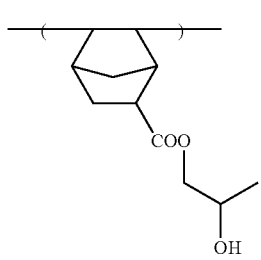

The alicyclic hydrocarbon-based acid-decomposable resin for use in the present invention preferably has a lactone group, more preferably a repeating unit containing a group having a lactone structure represented by the following formulae (Lc) or by any one of (III-1) to (III-5), and the group having a lactone structure may be bonded directly to the main chain.

(Lc) 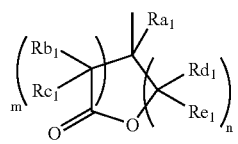

(III-1) 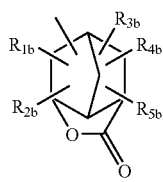

(III-2) 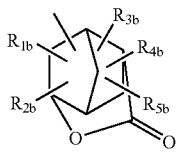

(III-3) 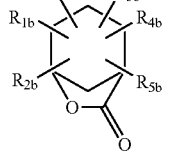

(III-4) 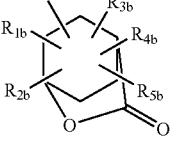

(III-5) 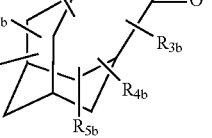

In formula (Lc), $Ra_1$, $Rb_1$, $Rc_1$, $Rd_1$, and $Re_1$, each independently represents a hydrogen atom or an alkyl group, m and n each independently represents an integer of 0 to 3, and m+n is from 2 to 6.

In formulae (III-1) to (III-5), $R_{1b}$ to $R_{5b}$ each independently represents a hydrogen atom, an alkyl group, a cycloalkyl group, an alkoxy group, an alkoxycarbonyl group, an alkylsulfonylimino group or an alkenyl group, and two out of $R_{1b}$ to $R_{5b}$ may combine to form a ring.

The alkyl group of $Ra_1$ to $Re_1$, in formula (Lc) and the alkyl group in the alkyl group, alkoxy group, alkoxycarbonyl group and alkylsulfonylimino group of $R_{1b}$ to $R_{5b}$ in formulae (III-1) to (III-5) include a linear or branched alkyl group and may have a substituent.

Preferred examples of the substituent include an alkoxy group having from 1 to 4 carbon atoms, a halogen atom (e.g., fluorine, chlorine, bromine, iodine), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms, and a nitro group.

Examples of the repeating unit containing a group having a lactone structure represented by formula (Lc) or by any one of formulae (III-1) to (III-5) include a repeating unit where at least one of $R_{13}'$ to $R_{16}'$ in formula (II-A) or (II-B) has a group represented by formula (Lc) or by any one of formulae (III-1) to (III-5) (for example, when $R_5$ of —$COOR_5$ is a group represented by formula (Lc) or by any one of formulae (III-1) to (III-5)), and a repeating unit represented by the following formula (AI):

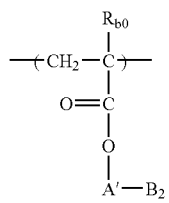

(AI)

In formula (AI), $R_{b0}$ represents a hydrogen atom, a halogen atom or an alkyl group having from 1 to 4 carbon atoms. Preferred examples of the substituent which the alkyl group of $R_{b0}$ may have include those described above as preferred examples of the substituent which the alkyl group of $R_{1b}$ in formulae (III-1) to (III-5) may have.

Examples of the halogen atom of $R_{b0}$ include a fluorine atom, a chlorine atom, a bromine atom and an iodine atom. $R_{b0}$ is preferably a hydrogen atom.

A' represents a single bond, an ether group, an ester group, a carbonyl group, an alkylene group or a divalent group comprising a combination thereof.

$B_2$ represents a group represented by formula (Lc) or by any one of formulae (III-1) to (III-5).

Specific examples of the repeating unit containing a group having a lactone structure are set forth below, but the present invention is not limited thereto.

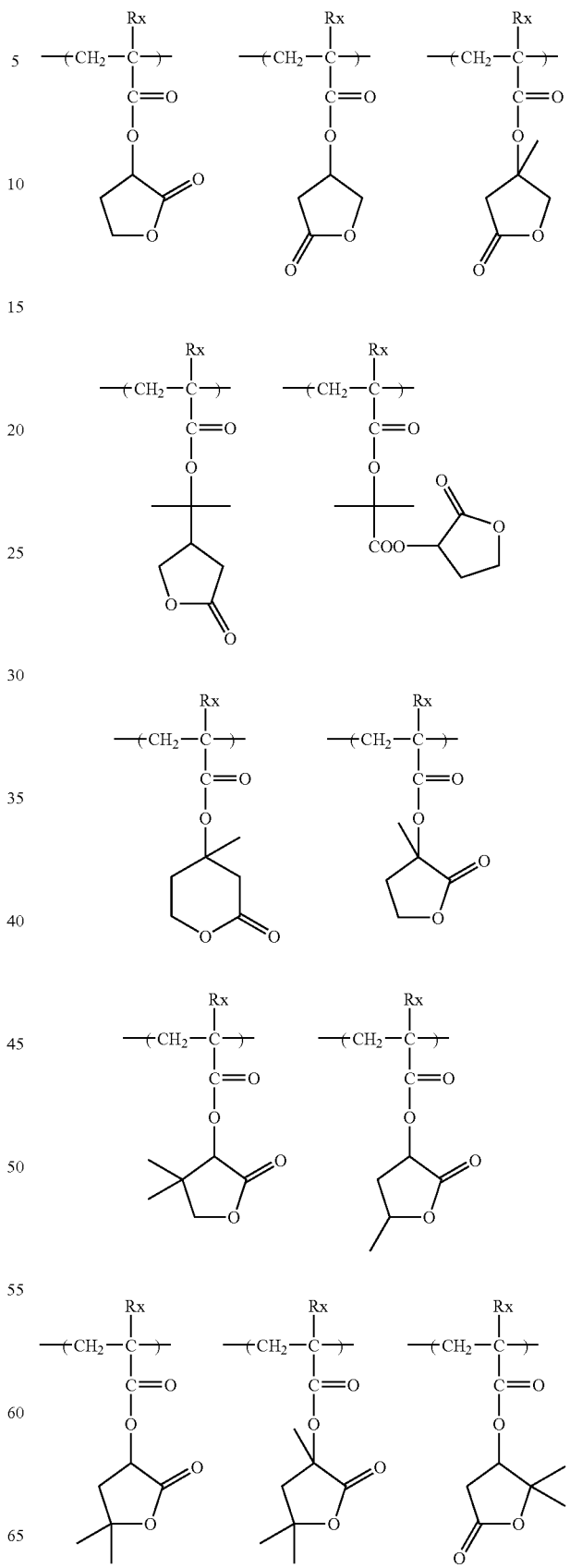

-continued
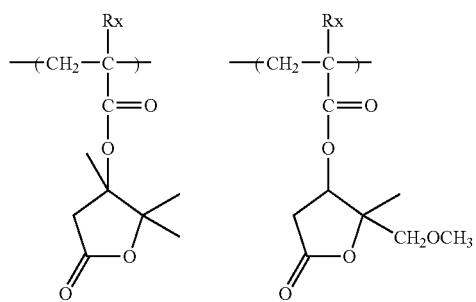
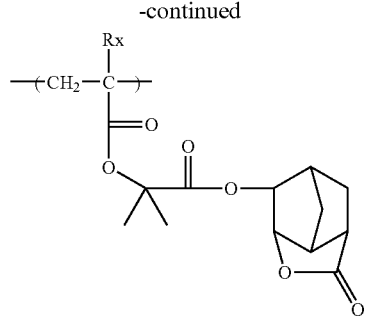
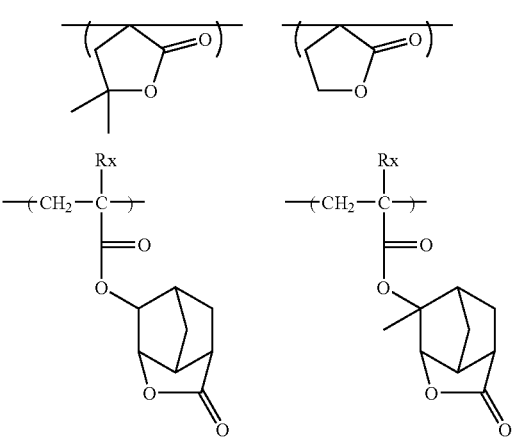
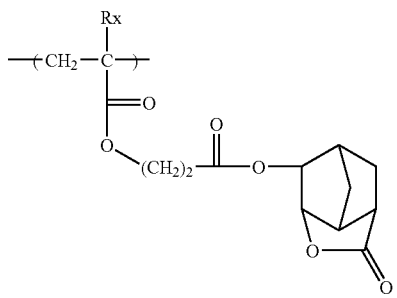
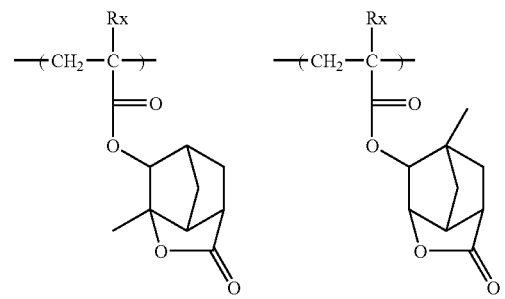
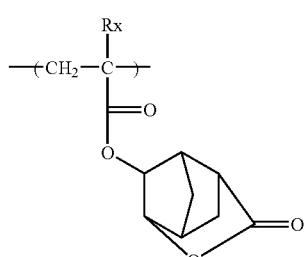
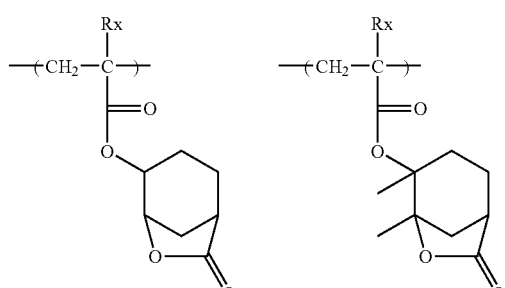
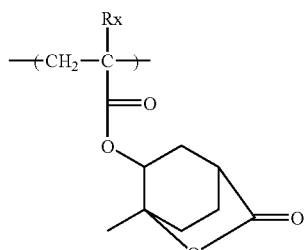
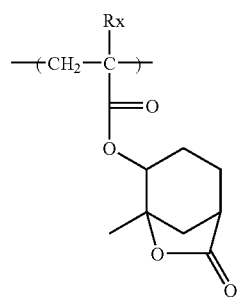
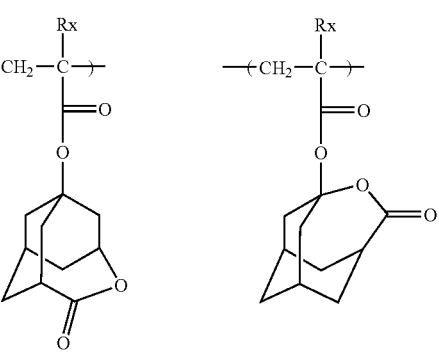

-continued

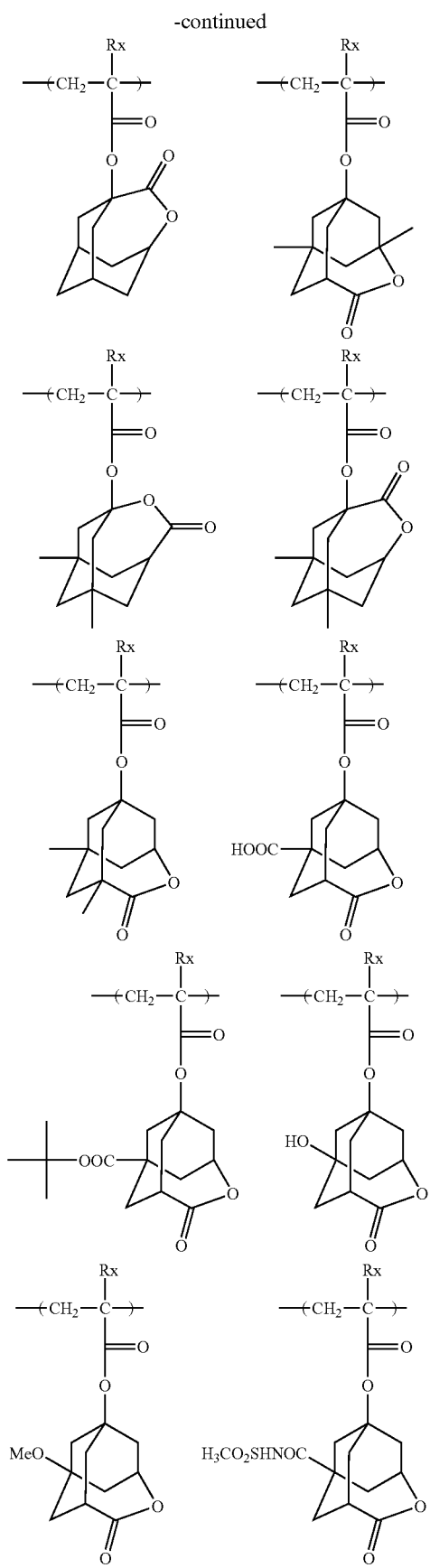

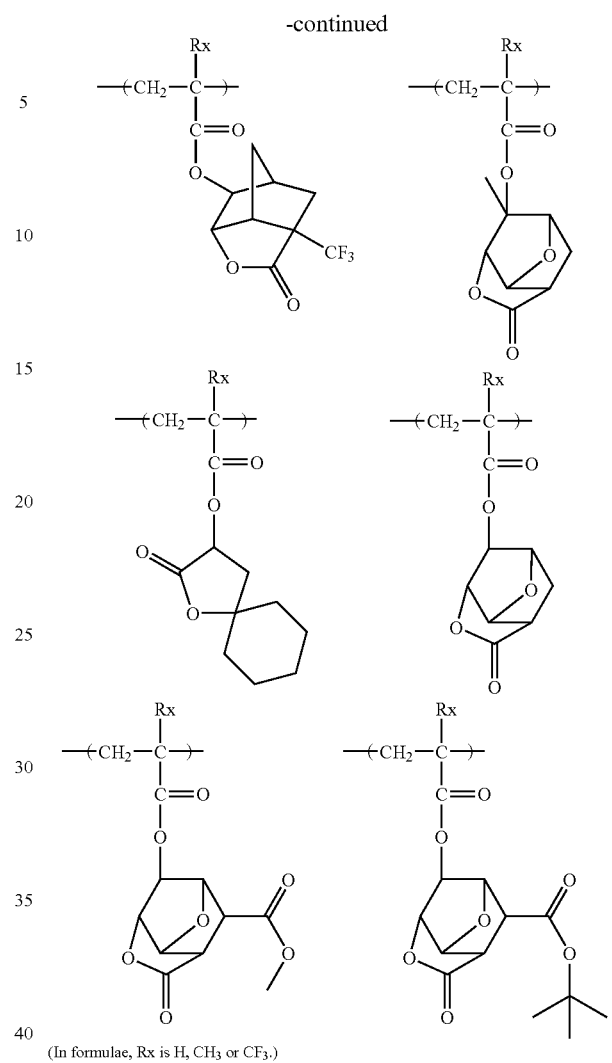

(In formulae, Rx is H, CH₃ or CF₃.)

The alicyclic hydrocarbon-based acid-decomposable resin for use in the present invention may contain a repeating unit having a group represented by the following formula (IV):

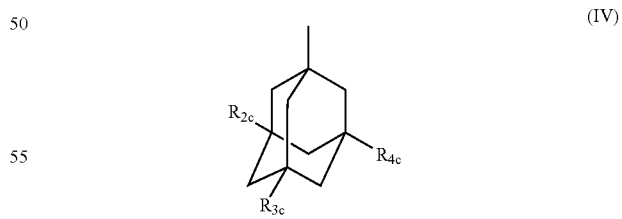

(IV)

wherein $R_{2c}$ to $R_{4c}$ each independently represents a hydrogen atom or a hydroxyl group, provided that at least one of $R_{2c}$ to $R_{4c}$ represents a hydroxyl group.

The group represented by formula (IV) is preferably a dihydroxy form or a monohydroxy form, more preferably a dihydroxy form.

Examples of the repeating unit having a group represented by formula (IV) include a repeating unit where at least one of $R_{13}'$ to $R_{16}'$ in formula (II-A) or (II-B) has a group represented by formula (IV) (for example, when $R_5$ in —COOR$_5$ is a group represented by formula (IV)), and a repeating unit represented by the following formula (AII):

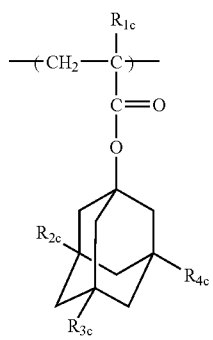

(AII)

wherein $R_{1c}$ represents a hydrogen atom or a methyl group, and $R_{2c}$ to $R_{4c}$ each independently represents a hydrogen atom or a hydroxyl group, provided that at least one of $R_{2c}$ to $R_{4c}$ represents a hydroxyl group. A repeating unit where two out of $R_{2c}$ to $R_{4c}$ are a hydroxyl group is preferred.

Specific examples of the repeating unit having the structure represented by formula (IV) are set forth below, but the present invention is not limited thereto.

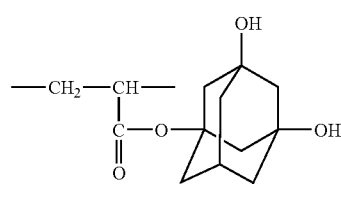

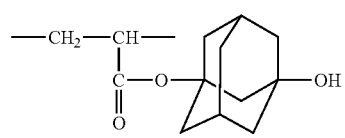

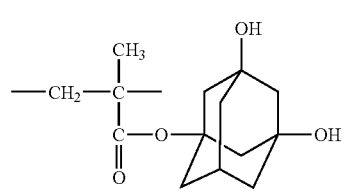

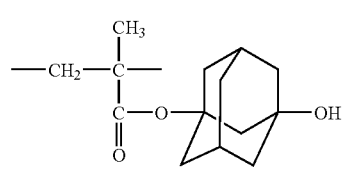

The alicyclic hydrocarbon-based acid-decomposable resin for use in the present invention may contain a repeating unit represented by the following formula (V):

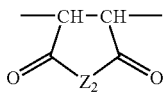

(V)

wherein $Z_2$ represents —O— or —N(R$_{41}$)—, $R_{41}$ represents a hydrogen atom, a hydroxyl group, an alkyl group or —OSO$_2$—R$_{42}$, and $R_{42}$ represents an alkyl group, a cycloalkyl group or a camphor residue. The alkyl group of $R_{41}$ and $R_{42}$ may be substituted by a halogen atom (preferably a fluorine atom) or the like.

Specific examples of the repeating unit represented by formula (V) are set forth below, but the present invention is not limited thereto.

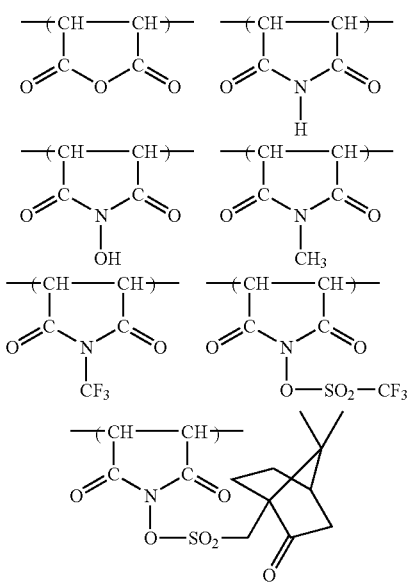

The alicyclic hydrocarbon-based acid-decomposable resin for use in the present invention may contain, in addition to the above-described repeating units, various repeating units for the purpose of controlling the dry etching resistance, suitability for standard developer, adhesion to substrate, resist profile and properties generally required of the resist, such as resolving power, heat resistance and sensitivity.

Examples of such repeating structural units include repeating structural units corresponding to the monomers described below, but the present invention is not limited thereto.

By containing these repeating structural units, the performances required of the alicyclic hydrocarbon-based acid-decomposable resin, particularly, (1) solubility in the coating solvent, (2) film-forming property (glass transition point), (3) alkali developability, (4) film loss (selection of hydrophilic, hydrophobic or alkali-soluble group), (5) adhesion of unexposed area to substrate, (6) dry etching resistance and the like can be subtly controlled.

Examples of the monomer include compounds having one addition polymerizable unsaturated bond, selected from acrylic acid esters, methacrylic acid esters, acrylamides, methacrylamides, allyl compounds, vinyl ethers and vinyl esters.

Other than these, an addition polymerizable unsaturated compound copolymerizable with the monomer corresponding to the above-described various repeating structural units may be copolymerized.

In the alicyclic hydrocarbon-based acid-decomposable resin, the molar ratio of each repeating structural unit contained is appropriately determined to control the dry etching resistance of resist, suitability for standard developer, adhesion to substrate, resist profile and performances generally required of the resist, such as resolving power, heat resistance and sensitivity.

Preferred embodiments of the alicyclic hydrocarbon-based acid-decomposable resin for use in the present invention include:

(1) a resin containing a repeating unit having an alicyclic hydrocarbon-containing partial structure represented by any one of formulae (pI) to (pVI) (side chain type), and (2) a resin containing a repeating unit represented by formula (II-AB) (main chain type), and the resin of (2) further includes, for example, (3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 70 mol %, more preferably from 20 to 65 mol %, still more preferably from 25 to 60 mol %, based on all repeating structural units.

In the alicyclic hydrocarbon-based acid-decomposable resin, the content of the repeating unit having an alicyclic hydrocarbon-containing partial structure represented by any one of formulae (pI) to (pVI) is preferably from 20 to 70 mol %, more preferably from 24 to 65 mol %, still more preferably from 28 to 60 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the resin, the content of the repeating structural unit based on the monomer as the further copolymerization component can also be appropriately selected according to the desired resist performance, but the content thereof is generally 99 mol % or less, more preferably 90 mol % or less, still more preferably 80 mol % or less, based on the total molar number of the repeating structural units having an alicyclic hydrocarbon-containing partial structure represented by formulae (pI) to (pVI) and the repeating unit represented by formula (II-AB).

When the composition of the present invention is used for exposure with ArF, the resin preferably has no aromatic group in view of the transparency to ArF light.

The alicyclic hydrocarbon-based acid-decomposable resin for use in the present invention can be synthesized by an ordinary method (for example, radical polymerization). In the general synthesis method, for example, monomer species are charged into a reactor all at once or on the way of reaction and dissolved, if desired, in a reaction solvent such as tetrahydrofuran, 1,4-dioxane, ethers (e.g., diisopropyl ether), ketones (e.g., methyl ethyl ketone, methyl isobutyl ketone) and esters (e.g., ethyl acetate), or in a solvent which dissolves the composition of the present invention, such as propylene glycol monomethyl ether acetate which is described later. The obtained uniform solution is, if desired, heated in an inert gas atmosphere such as nitrogen or argon, and the polymerization is started by using a commercially available radical initiator (e.g., azo-based initiator, peroxide). If desired, the initiator is added additionally or in parts. After the completion of reaction, the reactant is charged into a solvent and the desired polymer is recovered, for example, by a powder or solid recovery method. The reaction concentration is usually 20 mass % or more, preferably 30 mass % or more, more preferably 40 mass % or more, and the reaction temperature is usually from 10 to 150° C., preferably from 30 to 120° C., more preferably from 50 to 100° C. ("mass %" means "wt %" in this specification.).

The repeating structural units described above may be used individually or as a mixture of several units. Also, as for the resin for use in the present invention, one resin may be used or a plurality of resins may be used in combination.

The weight average molecular weight of the alicyclic hydrocarbon-based acid-decomposable resin for use in the present invention is preferably from 1,000 to 200,000, more preferably from 3,000 to 20,000, in terms of polystyrene by GPC method. With a weight average molecular weight of 1,000 or more, the heat resistance and dry etching resistance can be enhanced and with a weight average molecular weight of 200,000 or less, the developability and by virtue of decrease in the viscosity, the film-forming property can be enhanced.

The molecular weight distribution (Mw/Mn, also called dispersity) is usually from 1 to 5, preferably from 1 to 4, more preferably from 1 to 3. In view of resolution, resist profile, side wall of resist pattern, and roughness, the molecular weight distribution is preferably 5 or less.

In the chemical amplification-type resist composition for immersion exposure of the present invention, the amount of the alicyclic hydrocarbon-based acid-decomposable resin blended is preferably from 40 to 99.99 mass %, more preferably from 50 to 99.97 mass %, based on the entire resist solid content of the resist.

(B) Compound of Generating Acid Upon Irradiation with an Actinic Ray or Radiation The compound of generating an acid upon irradiation with an actinic ray or radiation (hereinafter sometimes referred to as "an acid generator"), for use in the resist composition for immersion exposure of the present invention, is described below.

The acid generator for use in the present invention can be selected from compounds generally used as the acid generator.

More specifically, an acid generator may be appropriately selected from a photoinitiator for photocationic polymerization, a photoinitiator for photoradical polymerization, a photo-decoloring agent for dyes, a photo-discoloring agent, known compounds of generating an acid upon irradiation with the actinic ray or radiation used for microresist and the like, and a mixture thereof.

Examples thereof include diazonium salt, phosphonium salt, sulfonium salt, iodonium salt, imidosulfonate, oxime sulfonate, diazodisulfone, disulfone and o-nitrobenzyl sulfonate.

In addition, compounds where the above-described group or compound of generating an acid upon irradiation with the actinic ray or radiation is introduced into the polymer main or side chain, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may also be used.

Furthermore, compounds of generating an acid under the action of light, described, for example, in U.S. Pat. No. 3,779,778 and European Patent 126,712 may also be used.

Among the acid generators, preferred are the compounds represented by the following formulae (ZI), (ZII) and (ZIII):

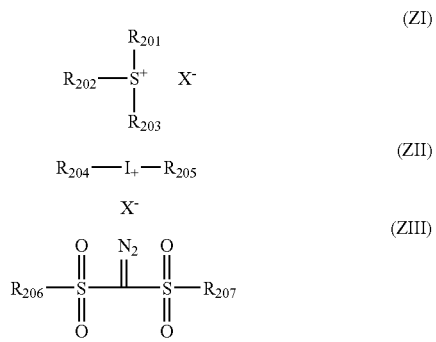

In formula (ZI), $R_{201}$, $R_{202}$ and $R_{203}$ each independently represents an organic group.

$X^-$ represents a non-nucleophilic anion.

The carbon number in the organic group of $R_{201}$, $R_{202}$ and $R_{203}$ is generally from 1 to 30, preferably from 1 to 20.

Two out of $R_{201}$ to $R_{203}$ may combine to form a ring structure and the ring may contain an oxygen atom, a sulfur atom, an ester bond, an amide bond or a carbonyl group.

Examples of the group formed by combining two out of $R_{201}$ to $R_{203}$ include an alkylene group (e.g., butylene, pentylene).

Specific examples of the organic group of $R_{201}$, $R_{202}$ and $R_{203}$ include the corresponding groups in the compounds (Z1-1), (Z1-2) and (Z1-3) described later.

The compound may have a plurality of structures represented by formula (Z1). For example, a compound having a structure that at least one of $R_{201}$ to $R_{203}$ in the compound represented by formula (Z1) is bonded to at least one of $R_{201}$ to $R_{203}$ in another compound represented by formula (Z1) may also be used.

The (Z1) component is more preferably a compound of (Z1-1), (Z1-2) or (Z1-3) described below.

The compound (Z1-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a tri-arylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group which is present, if desired, in the arylsulfonium compound is preferably a linear or branched alkyl group having from 1 to 15 carbon atoms, such as methyl group, ethyl group, propyl group, n-butyl group, sec-butyl group and tert-butyl group.

The cycloalkyl group which is present, if desired, in the arylsulfonium compound is preferably a cycloalkyl alkyl group having from 3 to 15 carbon atoms, such as cyclopropyl group, cyclobutyl group and cyclohexyl group.

The aryl group, alkyl group and cycloalkyl group of $R_{201}$ to $R_{203}$ each may have, as the substituent, an alkyl group (for example, having from 1 to 15 carbon atoms), a cycloalkyl group (for example, having from 3 to 15 carbon atoms), an aryl group (for example, having from 6 to 14 carbon atoms), an alkoxy group (for example, having from 1 to 15 carbon atoms), a halogen atom, a hydroxyl group, a phenylthio group or the like. The substituent is preferably a linear or branched alkyl group having from 1 to 12 carbon atoms, a cycloalkyl group having from 3 to 12 carbon atoms or an alkoxy group having from 1 to 12 carbon atoms, and most preferably an alkyl group having from 1 to 4 carbon atoms or an alkoxy group having from 1 to 4 carbon atoms. The substituent may be substituted to any one of $R_{201}$ to $R_{203}$ or may be substituted to all of these three groups. In the case where $R_{201}$ to $R_{203}$ are an aryl group, the substituent is preferably substituted at the p-position of the aryl group.

Examples of the non-nucleophilic anion as $X^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can prevent the decomposition in aging due to intramolecular nucleophilic reaction, whereby the aging stability of resist is enhanced.

Examples of the sulfonate anion include aliphatic sulfonate anion, aromatic sulfonate anion and camphorsulfonate anion.

Examples of the carboxylate anion include aliphatic carboxylate anion, aromatic carboxylate anion and aralkylcarboxylate anion.

The aliphatic group in the aliphatic sulfonate anion is preferably an alkyl group having from 1 to 30 carbon atoms, such as methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group and cycloalkyl group having from 3 to 30 carbon atoms, specifically, cyclopropyl group, cyclopentyl group, cyclohexyl group, adamantyl group, norbornyl group and boronyl group.

The aromatic group in the aromatic sulfonate anion is preferably an aryl group having from 6 to 14 carbon atoms, such as phenyl group, tolyl group and naphthyl group.

The alkyl group, cycloalkyl group and aryl group in the aliphatic sulfonate anion and aromatic sulfonate anion each may have a substituent.

Examples of the substituent include a nitro group, a halogen atom (e.g., fluorine, chlorine, bromine, iodine), a carboxyl group, a hydroxyl group, an amino group, a cyano group, an alkoxy group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms) and an alkylthio group (preferably having from 1 to 15 carbon atoms). As for the aryl group and ring structure in each group, examples of the substituent further include an alkyl group (preferably having from 1 to 15 carbon atoms).

Examples of the aliphatic group in the aliphatic carboxylate anion are the same as those of the aliphatic group in the aliphatic sulfonate anion.

Examples of the aromatic group in the aromatic carboxylate anion are the same as those of the aromatic group in the aromatic sulfonate anion.

The aralkyl group in the aralkylcarboxylate anion is preferably an aralkyl group having from 6 to 12 carbon atoms, such as benzyl group, phenethyl group, naphthylmethyl group, naphthylethyl group and naphthylmethyl group.

The aliphatic group, aromatic group and aralkyl group in the aliphatic carboxylate anion, aromatic carboxylate anion and aralkylcarboxylate anion each may have a substituent and examples of the substituent include the same halogen atom, alkyl group, cycloalkyl group, alkoxy group and alkylthio group as in the case of aliphatic sulfonate anion.

Examples of the sulfonylimide anion include saccharin anion.

The alkyl group in the bis(alkylsulfonyl)imide anion and tris(alkylsulfonyl)methyl anion is preferably an alkyl group having from 1 to 5 carbon atoms, such as methyl group, ethyl group, propyl group, isopropyl group, n-butyl group, isobutyl group, sec-butyl group, pentyl group and neopentyl group. The alkyl group may have a substituent and examples of the substituent include a halogen atom, a halogen atom-substituted alkyl group, an alkoxy group and an alkylthio group, with a halogen atom-substituted alkyl group being preferred.

Other examples of the non-nucleophilic anion include phosphorus fluoride, boron fluoride and antimony fluoride.

The non-nucleophilic anion of $X^-$ is preferably an aliphatic sulfonate anion with the α-position of sulfonic acid being substituted by a fluorine atom, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom, more preferably a perfluoroaliphatic sulfonate anion having from 4 to 8 carbon atoms or an aromatic sulfonate anion having a fluorine atom, and most preferably nonafluorobutanesulfonate anion, perfluorooctanesulfonate anion, pentafluorobenzenesulfonate anion or 3,5-bis(trifluoromethyl)benzenesulfonate anion.

The compound (Z1-2) is described below.

The compound (Z1-2) is a compound where $R_{201}$ to $R_{203}$ in formula (ZI) each independently represents an organic group not containing an aromatic ring. The aromatic ring as used herein includes an aromatic ring containing a heteroatom.

The aromatic ring-free organic group of $R_{201}$ to $R_{203}$ generally has from 1 to 30 carbon atoms, preferably from 1 to 20 carbon atoms.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, and most preferably a linear or branched 2-oxoalkyl group.

The alkyl group of $R_{201}$ to $R_{203}$ may be linear or branched and is preferably a linear or branched alkyl group having from 1 to 10 carbon atoms (e.g., methyl, ethyl, propyl, butyl, pentyl), more preferably a linear or branched 2-oxoalkyl group or an alkoxycarbonylmethyl group.

The cycloalkyl group of $R_{201}$ to $R_{203}$ is preferably a cycloalkyl group having from 3 to 10 carbon atoms (e.g., cyclopentyl, cyclohexyl, norbornyl), more preferably a 2-oxocycloalkyl group.

The 2-oxoalkyl group may be linear, branched or cyclic and is preferably a group having $>C=O$ at the 2-position of the above-described alkyl or cycloalkyl group.

The alkoxy group in the alkoxycarbonylmethyl group is preferably an alkyl group having from 1 to 5 carbon atoms (e.g., methyl, ethyl, propyl, butyl, pentyl).

$R_{201}$ to $R_{203}$ may be further substituted by a halogen atom, an alkoxy group (for example, having from 1 to 5 carbon atoms), a hydroxyl group, a cyano group or a nitro group.

Two out of $R_{201}$ to $R_{203}$ may combine to form a ring structure and the ring may contain an oxygen atom, a sulfur atom, an ester bond, an amide bond or a carbonyl group. Examples of the group formed by combining two out of $R_{201}$ to $R_{203}$ include an alkylene group (e.g., butylene, pentylene).

The compound (Z1-3) is a compound represented by the following formula (Z1-3) and this is a compound having a phenacylsulfonium salt structure.

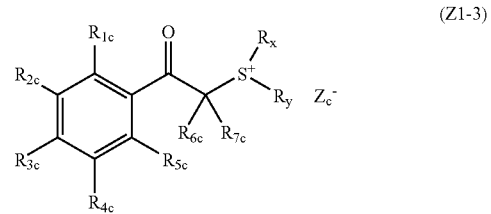

(Z1-3)

$R_{1c}$ to $R_{5c}$ each independently represents a hydrogen atom, an alkyl group, a cycloalkyl group, an alkoxy group or a halogen atom.

$R_{6c}$ and $R_{7c}$ each represents a hydrogen atom, an alkyl group or a cycloalkyl group.

$R_x$ and $R_y$ each independently represents an alkyl group, a cycloalkyl group, an allyl group or a vinyl group.

Any two or more out of $R_{1c}$ to $R_{5c}$, or $R_x$ and $R_y$, may combine to form a ring structure and the ring structure may contain an oxygen atom, a sulfur atom, an ester bond or an amide bond.

$Zc^-$ represents a non-nucleophilic anion and examples thereof are the same as those of the non-nucleophilic anion of $X^-$ in formula (ZI).

The alkyl group of $R_{1c}$ to $R_{7c}$ is preferably a linear or branched alkyl group having from 1 to 20 carbon atoms, such as methyl group, ethyl group, linear or branched propyl group, linear or branched butyl group, and linear or branched pentyl group.

The cycloalkyl group of $R_{1c}$ to $R_{7c}$ is preferably a cycloalkyl group having from 3 to 8 carbon atoms, such as cyclopentyl group and cyclohexyl group.

The alkoxy group of $R_{1c}$ to $R_{5c}$ may be linear, branched or cyclic and this is, for example, an alkoxy group having from 1 to 10 carbon atoms, preferably a linear or branched alkoxy group having from 1 to 5 carbon atoms (e.g., methoxy, ethoxy, linear or branched propoxy, linear or branched butoxy, linear or branched pentoxy) or a cyclic alkoxy group having from 3 to 8 carbon atoms (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon atoms of $R_{1c}$ to $R_{5c}$ is from 2 to 15 is more preferred. By using such a compound, the solubility in solvent is enhanced and the generation of particles during storage is prevented.

Examples of the alkyl group and cycloalkyl group of $R_x$ and $R_y$ are the same as those of the alkyl group and cycloalkyl group of $R_{1c}$ to $R_{7c}$. Among these, preferred are a 2-oxoalkyl group, 2-oxocycloalkyl group and an alkoxycarbonylmethyl group.

Examples of the 2-oxoalkyl group and 2-oxocycloalkyl group include a group having >C=O at the 2-position of the alkyl group or cycloalkyl group of $R_{1c}$ to $R_{7c}$.

Examples of the alkoxy group in the alkoxycarbonylmethyl group are the same as those of the alkoxy group of $R_{1c}$ to $R_{5c}$.

Examples of the group formed by combining $R_x$ and $R_y$ include a butylene group and a pentylene group.

$R_x$ and $R_y$ each is preferably an alkyl group having 4 or more carbon atoms, more preferably 6 or more carbon atoms, still more preferably 8 or more carbon atoms.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group of $R_{204}$ to $R_{207}$ is preferably a linear or branched alkyl group having from 1 to 10 carbon atoms (e.g., methyl, ethyl, propyl, butyl, pentyl).

The cycloalkyl group of $R_{204}$ to $R_{20}7$ is preferably a cycloalkyl group having from 3 to 10 carbon atoms (e.g., cyclopentyl, cyclohexyl, norbornyl).

Examples of the substituent which $R_{204}$ to $R_{207}$ may have include an alkyl group (for example, having from 1 to 15 carbon atoms), a cycloalkyl group (for example, having from 3 to 15 carbon atoms), an aryl group (for example, having from 6 to 15 carbon atoms), an alkoxy group (for example, having from 1 to 15 carbon atoms), a halogen atom, a hydroxyl group and a phenylthio group.

$X^-$ represents a non-nucleophilic anion and examples thereof are the same as those of the non-nucleophilic anion of $X^-$ in formula (ZI).

Among the acid generators, also preferred are the compounds represented by the following formulae (ZIV), (ZV) and (ZVI):

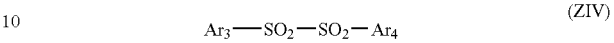
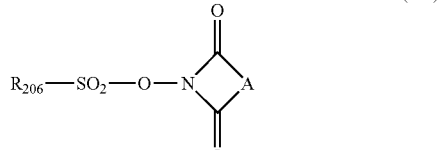
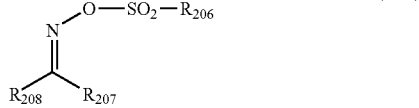

In formulae (ZIV) to (ZVI), $Ar_3$ and $Ar_4$ each independently represents an aryl group.

$R_{206}$, $R_{207}$ and $R_{208}$ each represents an alkyl group, a cycloalxyl group or an aryl group, and these are the same as the alkyl group, cycloalkyl group and aryl group of $R_{204}$ to $R_{207}$.

A represents an alkylene group, an alkenylene group or an arylene group.

Among the acid generators, more preferred are the compounds represented by formulae (ZI) to (ZIII).

Particularly preferred examples of the compound of generating an acid upon irradiation with the actinic ray or radiation are set forth below.

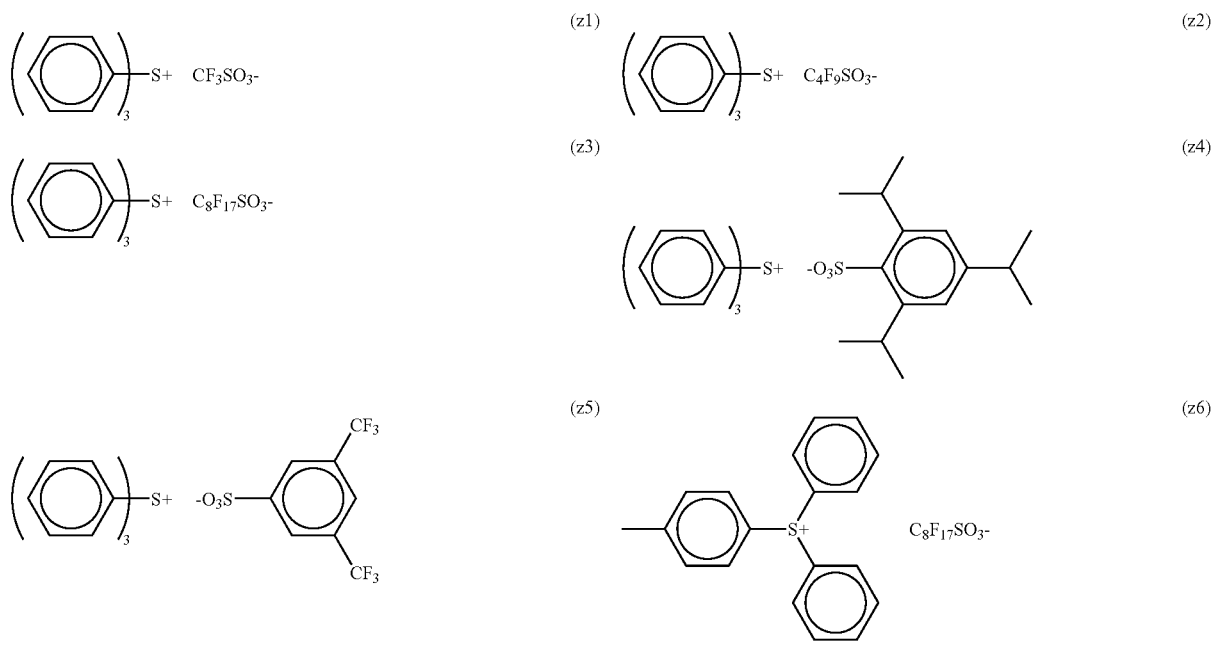

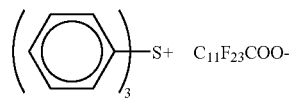 (z7)
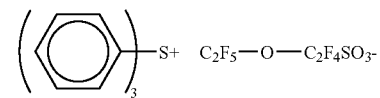 (z8)
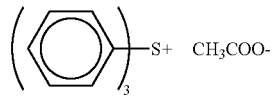 (z9)
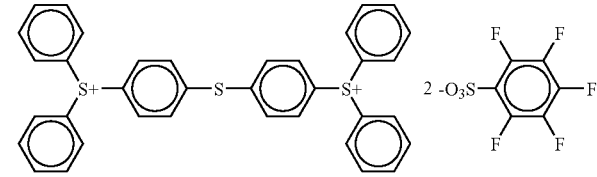 (z10)
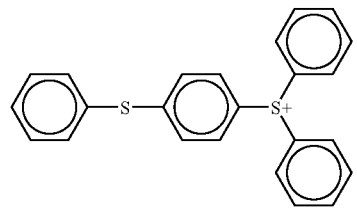 (z11)
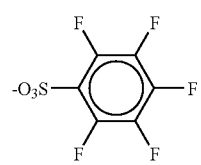 (z12)
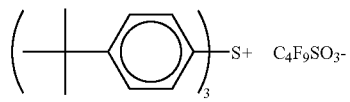 (z13)
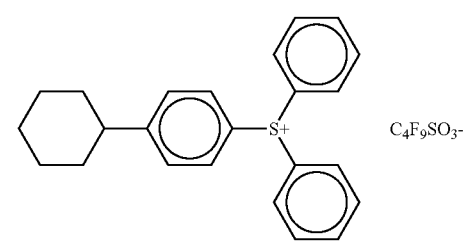 (z14)
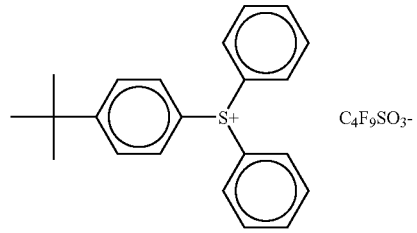 (z15)
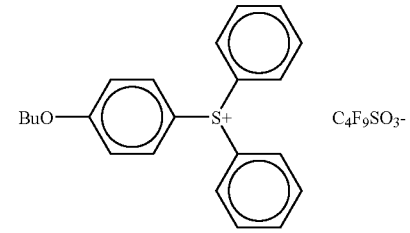 (z16)
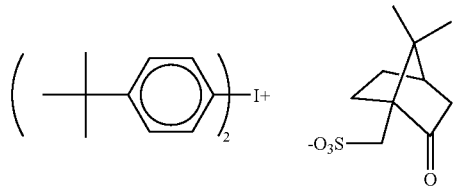 (z17)
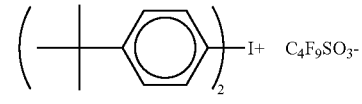 (z18)
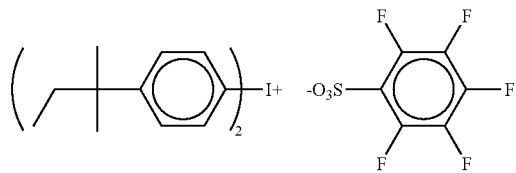 (z19)
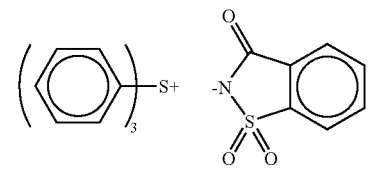 (z20)
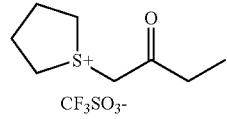 (z21)
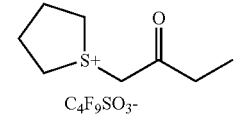 (z22)

-continued
(z23)
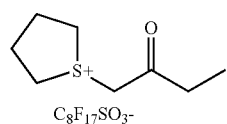
C8F17SO3-
(z24)
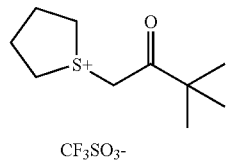
CF3SO3-
(z25)
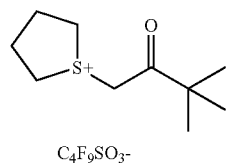
C4F9SO3-
(z26)
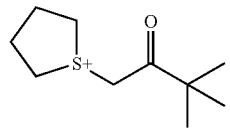
C8F17SO3-
(z27)
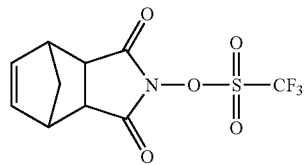
(z28)
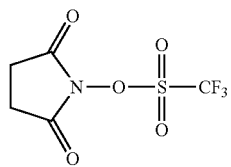
(z29)
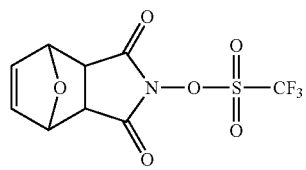
(z30)
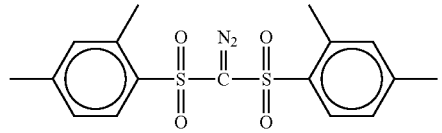
(z31)
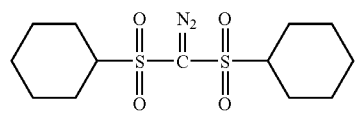
(z32)
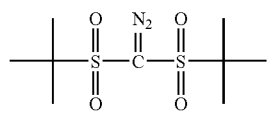
(z33)
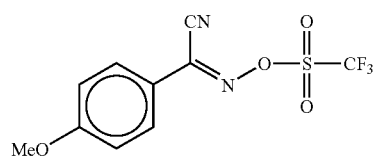
(z34)
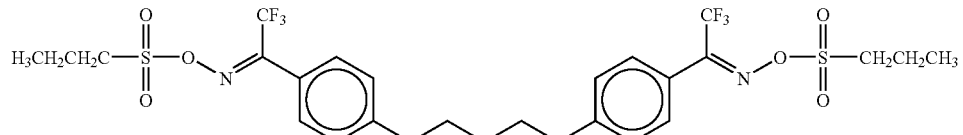
(z35)
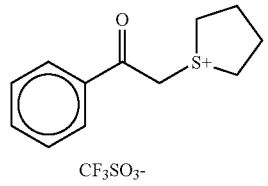
CF3SO3-
(z36)
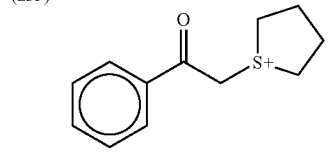
C4F9SO3-
(z37)
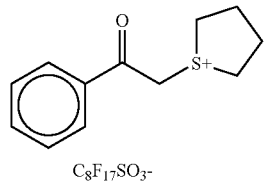
C8F17SO3-
(z38)
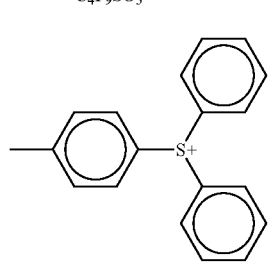
C4F9SO3-

-continued
(z39)
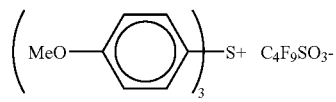
(z40)
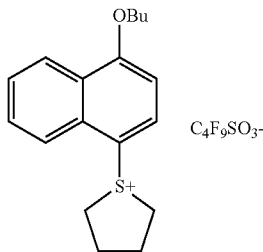
(z41)
(z42)
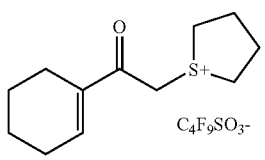
(z43)
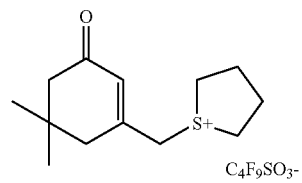
(z44)
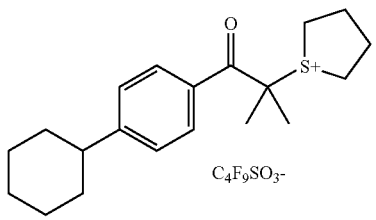
(z45)
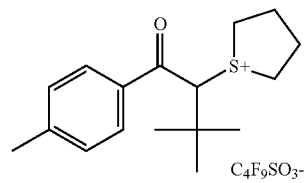
(z46)
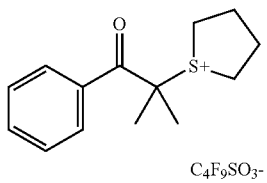
(z47)
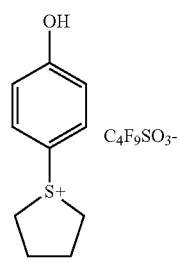
(z48)
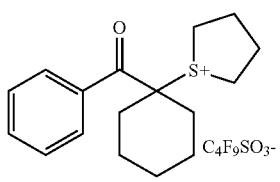
(z49)
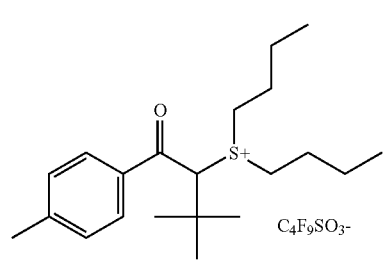
(z50)
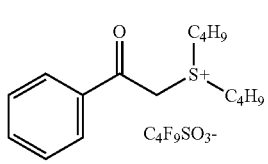
(z51)
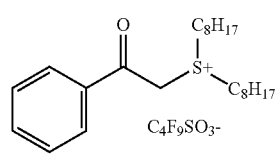
(z52)
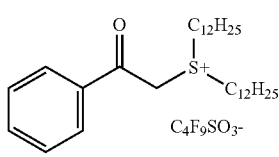

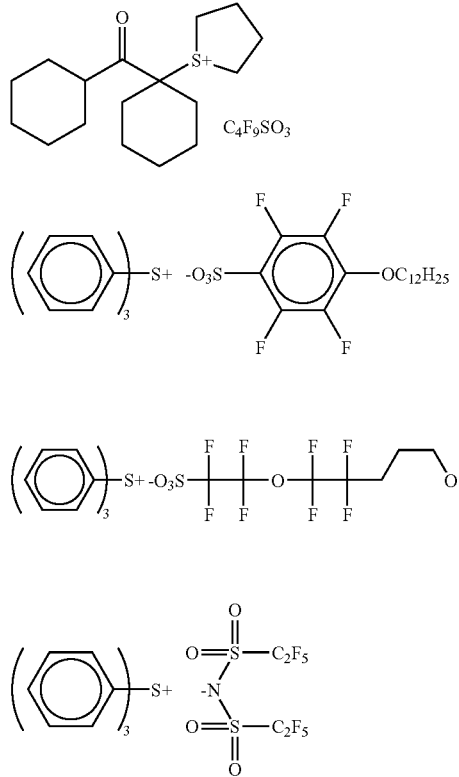

The acid generators can be used individually or in combination of two or more thereof.

The acid generator content in the resist composition for immersion exposure is preferably from 0.1 to 20 mass %, more preferably from 0.5 to 10 mass %, still more preferably from 1 to 7 mass %, based on the entire solid content of the resist composition.

(C) Organic Solvent

The resist composition for immersion exposure of the present invention is used by dissolving the above-described components in a predetermined organic solvent.

The solvent for use in the present invention contains an alkylene glycol alkyl ether carboxylate and a propylene glycol monomethyl ether (PGME).

The alkylene glycol alkyl ether carboxylate is preferably an alkylene glycol monoalkyl ether acetate and preferred examples thereof include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate. Among these, propylene glycol monomethyl ether acetate (PGMEA) is more preferred.

From the standpoint of satisfying both profile and DOF, the mixing ratio (by mass) of the alkylene glycol alkyl ether carboxylate to the propylene glycol monomethyl ether (PGME) is preferably alkylene glycol alkyl ether acetate/PGME= from 40/60 to 90/10, more preferably alkylene glycol alkyl ether carboxylate/PGME= from 45/55 to 85/15, still more preferably from 50/50 to 80/20, yet still more preferably from 60/40 to 75/25.

In addition these alkylene glycol alkyl ether carboxylate and PGME, a solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone, methoxybutanol and tetrahydrofuran may be used in combination. In the case of using such a solvent other than alkylene glycol alkyl ether carboxylate and PGME in combination, this solvent is preferably mixed at a ratio of 20 mass % or less, more preferably 10 mass % or less.

(D) Basic Compound

The resist composition for immersion exposure of the present invention preferably further contains a basic compound. Examples of the basic compound include nitrogen-containing basic compounds, basic ammonium salts, basic sulfonium salts and basic iodonium salts, and those of not deteriorating sublimation or resist performance may be used.

The basic compound is a component having a function of suppressing the phenomenon of causing the acid generated from the acid generator upon exposure to diffuse in the resist film and preventing occurrence of an undesired chemical reaction in the non-exposed region. When such a basic compound is blended, the acid generated from the acid generator upon exposure is prevented from the diffusion phenomenon in the resist film and the storage stability of the obtained resist composition for immersion exposure is enhanced. Furthermore, not only the resolution as a resist in more enhanced but also the resist pattern can be prevented from changes in the line width due to fluctuation of the post-exposure time delay (PED) from exposure to development and a composition having very excellent process stability can be obtained.

Examples of the nitrogen-containing basic compound include aliphatic primary, secondary or tertiary amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, imide derivatives and nitrogen-containing compounds having a cyano group.

Examples of the aliphatic amines include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, dimethylamine, diethylamine, di-n-propylamine, diisopropylamine, di-n-butylamine, diisobutyl-amine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine and benzyldimethylamine.

Examples of the aromatic amines and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine), diphenyl (p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole), oxazole derivatives (e.g., oxazole, isoxazole), thiazole derivatives (e.g., thiazole and isothiazole), imidazole derivatives (e.g., imidazole, 4-methylimidazole, 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compounds having a carboxyl group include aminobenzoic acid, indolecarboxylic acid and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of the nitrogen-containing compounds having a sulfonyl group include 3-pyridinesulfonic acid and pyridinium p-toluenesulfonate.

Examples of the nitrogen-containing compounds having a hydroxyl group include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, trisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide and N-(2-hydroxyethyl)isonicotinamide.

Examples of the amide derivatives include formamide, N-methylformamide, N,N-dimethylformamide, acetamide, N-methylacetamide, N,N-dimethylacetamide, propionamide and benzamide.

Examples of the imide derivatives include phthalimide, succinimide and maleimide.

Specific examples of the nitrogen-containing compounds having a cyano group include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2- cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyano-methyl) aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis (2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate and 2-cyanoethyl 4-morpholinepropionate.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidines, hexamethylenetetramine, imidazoles, hyroxypyridines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, tri-1-octylamine, tris(ethylhexyl)amine, tridecylamine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)-propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis (2-diethylaminoethyl)ether, N,N,N',N'-tetrakis(2-hydroxypropyl)ethylenediamine, tri-(cyclo)alkylamines (e.g., tricyclohexylamine), aromatic amines (e.g., aniline, N-methylaniline, N,N-dimethylaniline, 2-methylaniline, 3-methylaniline, 4-methylaniline, 4-nitroaniline, diphenylamine, triphenylamine, naphthylamine, 1,6-diisopropylaniline), polyethyleneimine, polyallylamine, a polymer of 2-dimethylaminoethylacrylamide, N-tert-butoxycarbonyl di-n-octylamine, N-tert-butoxycarbonyl di-n-nonylamine, N-tert-butoxycarbonyl di-n-decylamine, N-tert-butoxycarbonyl dicyclohexylamine, N-tert-butoxycarbonyl-1-adamantylamine, N-tert-butoxycarbonyl-N-methyl-1-adamantylamine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N'N'-tetra-tert-butoxycarbonylhexamethylenediamine, N,N'-di-tert-butoxycarbonyl-1,7-diaminoheptane, N,N'-di-tert-butoxy-carbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole, N-tert-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenylurea, tri-n-butylthiourea, imidazoles (e.g., imidazole, 4-methylimidazole, 4-methyl-2-phenylimidazole, benzimidazole, 2-phenylbenzimidazole), pyridines (e.g., pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine), piperazines (e.g., piperazine, 1-(2-hydroxyethyl)piperazine), pyrazine, pyrazole, pyridazine, quinoxaline, purine, pyrrolidine, piperidine, 3-piperidino-1,2-propanediol, morpholine, 4-methylmorpholine, 1,4-dimethylpiperazine.

Among these, preferred are 1,5-diazabicyclo[4.3.0]-5-nonene, 1,8-diazabicyclo[5.4.0]-7-undecene, 1,4-diaza-bicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, 4,4'-diaminodiphenylether, triethylamine, tributylamine, tripentylamine, tri-n-octylamine, tris(ethylhexyl)amine, tridodecylamine, N,N-dihydroxyethylaniline and N-hydroxyethyl-N-ethylaniline.

In the resist composition for immersion exposure of the present invention, a basic ammonium salt may be further used as the basic compound. Specific examples of the basic ammonium salt include, but are not limited to, the following compounds.

Specific examples thereof include ammonium hydroxide, ammonium triflate, ammonium pentaflate, ammonium heptaflate, ammonium nonaflate, ammonium undecaflate, ammonium trideca-flate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxylate, ammonium tridecylcarboxylate, ammonium tetradecylcarboxylate, ammonium pentadecylcarboxylate, ammonium hexadecylcarboxylate, ammonium heptadecylcarboxylate and ammonium octadecylcarboxylate.

Specific examples of the ammonium hydroxide include tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethyl-ammonium hydroxide, tetrakisdecylammonium hydroxide, dodecyltrimethylammonium hydroxide, dodecylethyldimethylammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethylammonium hydroxide, dimethyldioctadecylammonium hydroxide, tetraoctadecylammonium hydroxide, diallyldimethylammonium hydroxide, (2-chloroethyl)-trimethylammonium hydroxide, (2-bromoethyl)trimethylammonium hydroxide, (3-bromopropyl)-trimethylammonium hydroxide, (3-bromopropyl)triethylammonium hydroxide, glycidyl trimethylammonium hydroxide, choline hydroxide, (R)-(+)-(3-chloro-2-hydroxypropyl)trimethylammonium hydroxide, (S)-(−)-(3-chloro-2-hydroxypropyl)trimethylammonium hydroxide, (3-chloro-2-hydroxypropyl)trimethylammonium hydroxide, (2-aminoethyl)-trimethylammonium hydroxide, hexamethonium hydroxide, decamethonium hydroxide, 1-azonia-propellane hydroxide, petronium hydroxide, 2-chloro-1,3-dimethyl-2-imidazolinium hydroxide and 3-ethyl-2-methyl-2-thiazolinium hydroxide.

One of these basic compounds may be used alone or two or more basic compounds may be used. It is preferred to use two or more basic compounds.

The amount of the basic compound used is, as a total amount, usually from 0.001 to 10 mass %, preferably from 0.01 to 5 mass %, based on the solid content of the resist composition for immersion exposure.

(E) Surfactant

The resist composition for immersion exposure of the present invention preferably contains a surfactant, more preferably one or more of fluorine- and/or silicon-containing surfactants (a fluorine-containing surfactant, a silicon-containing surfactant and a surfactant containing both a fluorine atom and a silicon atom).

When the resist composition for immersion exposure of the present invention contains (E) the surfactant described above, a resist pattern having good sensitivity, resolution and adhesion and less development defects can be obtained on use of an exposure light source of 250 nm or less, particularly 220 nm or less.

Examples of the fluorine- and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be as-is used.

Examples of the commercially available surfactant which can be used include fluorine-containing surfactants and silicon-containing surfactants, such as EFtop EF301 and EF303 (produced by Shin-Akita Kasei K.K.), Florad FC430 and 431 (produced by Sumitomo 3M Inc.), Megafac F171, F173, F176, F189 and R08, (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, surfactants using a polymer having a fluoro-aliphatic group derived from a fluoro-aliphatic compound, produced by telomerization (also called telomer process) or oligomerization (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene)) acrylate and/or (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group). This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) may be not only a binary copolymer but also a ternary or higher copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), copolymers of a $C_6F_{13}$ group-containing acrylate (or methacrylate) and a (poly(oxyalkylene)) acrylate (or methacrylate), copolymers of a $C_6F_{13}$ group-containing acrylate (or methacrylate), a (poly(oxyethylene)) acrylate (or methacrylate) and a (poly(oxypropylene)) acrylate (or methacrylate), copolymers of a $C_8F_{17}$ group-containing acrylate (or methacrylate) and a (poly(oxyalkylene)) acrylate (or methacrylate), and copolymers of a $C_8F_{17}$ group-containing acrylate (or methacrylate), a (poly(oxyethylene)) acrylate (or methacrylate) and a (poly(oxypropylene)) acrylate (or methacrylate).

In the present invention, surfactants other than the fluorine-containing and/or silicon-containing surfactants can also be added. Specific examples thereof include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate).

One of these surfactants may be used alone or some of these surfactants may be used in combination.

The amount of (E) the surfactant used is preferably from 0.0001 to 2 mass %, more preferably from 0.001 to 1 mass %, based on the entire amount (excluding the solvent) of the resist composition for immersion exposure.

(F) Dissolution Inhibiting Compound Having a Molecular Weight of 3,000 or Less and Capable of Decomposing Under an Action of an Acid to Increase the Solubility in an Alkali Developer The resist composition for immersion exposure of the present invention preferably contains a dissolution inhibiting compound having a molecular weight of 3,000 or less and capable of decomposing under an action of an acid to increase the solubility in an alkali developer (hereinafter sometimes referred to as "a dissolution inhibiting compound").

In order to prevent reduction in the transmittance at 220 nm or less, the dissolution inhibiting compound is preferably an alicyclic or aliphatic compound containing an acid-decomposable group, such as acid-decomposable group-containing cholic acid derivative described in Proceeding of SPIE, 2724, 355 (1996). Examples of the acid-decomposable group and the alicyclic structure include those described above regarding the resin as the component (A).

The molecular weight of the dissolution inhibiting compound for use in the present invention is 3,000 or less, preferably from 300 to 3,000, more preferably from 500 to 2,500.

The amount of the dissolution inhibiting compound added is preferably from 1 to 30 mass %, more preferably from 2 to 20 mass %, based on the entire solid content of the resist composition for immersion exposure.

Specific examples of the dissolution inhibiting compound are set forth below, but the present invention is not limited thereto.

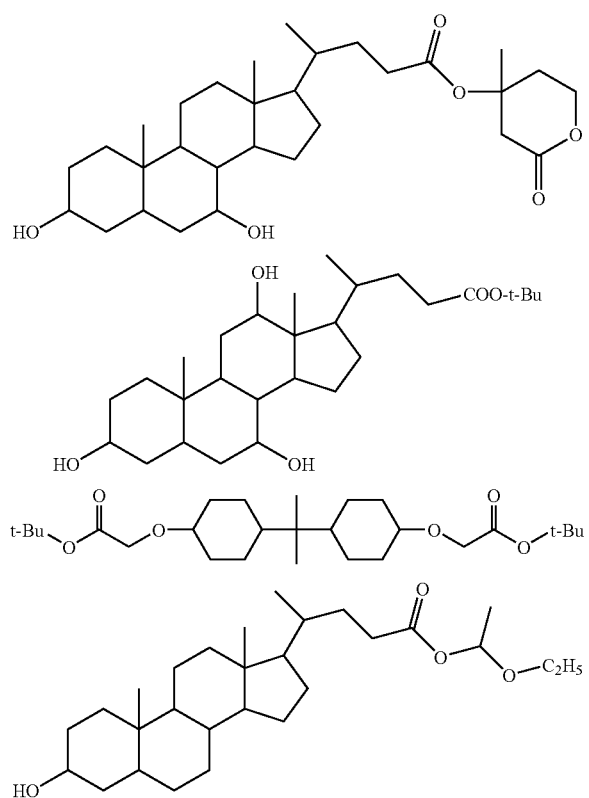

-continued

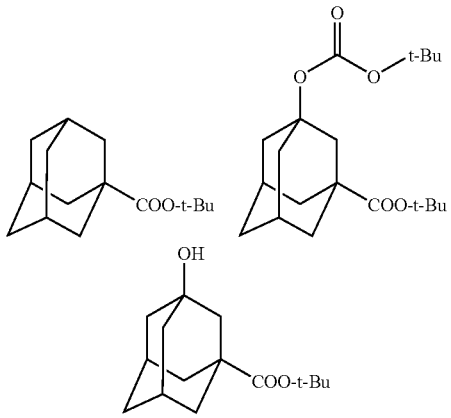

(G) Alkali-Soluble Resin

The resist composition for immersion exposure of the present invention may further contain a resin soluble in an alkali developer and by containing this resin, the sensitivity is elevated.

In the present invention, novolak resins having a molecular weight of approximately from 1,000 to 20,000, and polyhydroxystyrene derivatives having a molecular weight of approximately from 3,000 to 50,000 can be used as this resin, but such a resin has large absorption to light of 250 nm or less and therefore, is preferably used after partially hydrogenating it or in an amount of 30 mass % or less of the entire resin amount.

Also, a resin having a carboxyl group as the alkali-soluble group may be used. The carboxyl group-containing resin preferably has a monocyclic or polycyclic alicyclic hydrocarbon group so as to enhance the dry etching resistance. Specific examples thereof include copolymers of a (meth) acrylic acid with a methacrylic acid ester having an alicyclic hydrocarbon structure not exhibiting acid decomposability, and (meth)acrylic acid ester resins of an alicyclic hydrocarbon group having a carboxyl group at the end.

The amount of the alkali-soluble resin added is usually 30 mass % or less based on the total amount of the resins including the acid-decomposable resin.

(H) Onium Carboxylate

The resist composition for immersion exposure of the present invention may contain an onium carboxylate.

Examples of the onium carboxylate for use in the present invention include sulfonium carboxylate, iodonium carboxylate and ammonium carboxylate. In particular, (H) the onium carboxylate is preferably an iodonium salt or a sulfonium salt. Also, in the onium carboxylate for use in the present invention, the carboxylate residue is preferably free from an aromatic group and a carbon-carbon double bond. The anion moiety is preferably a linear, branched, monocyclic or polycyclic alkyl carboxylate anion having from 1 to 30 carbon atoms, more preferably a carboxylate anion where the alkyl group is partially or entirely substituted by fluorine. The alkyl chain may contain an oxygen atom. By using such an anion, the transparency to light of 220 nm or less is secured, the sensitivity and the resolving power are enhanced, and the defocus latitude depended on line pitch and the exposure margin are improved.

Examples of the fluorine-substituted carboxylate anion include fluoroacetate anion, difluoroacetate anion, trifluoroacetate anion, pentafluoropropionate anion, heptaflurobutyrate anion, nonafluoropentanoate anion, perfluorododecanoate anion, perfluorotridecanoate anion, perfluorocyclohexanecarboxylate anion and 2,2-bistrifluoromethylpropionate anion.

These onium carboxylates can be synthesized by reacting a sulfonium, iodonium or ammonium hydroxide and a carboxylic acid with silver oxide in an appropriate solvent.

The onium carboxylate content in the composition is suitably from 0.1 to 20 mass %, preferably from 0.5 to 10 mass %, more preferably from 1 to 7 mass %, based on the entire solid content of the composition.

Other Additives:

The resist composition for immersion exposure of the present invention may further contain, if desired, a dye, a plasticizer, a photosensitizer and a compound which accelerates the dissolution in a developer (for example, a phenol compound having a molecular weight of 1,000 or less or a carboxyl group-containing alicyclic or aliphatic compound).

The phenol compound having a molecular weight of 1,000 or less can be easily synthesized by one skilled in the art while referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, carboxylic acid derivatives having a steroid structure, such as cholic acid, deoxycholic acid and lithocholic acid, adamantane carboxylic acid derivatives, an adamantane dicarboxylic acid, a cyclohexanecarboxylic acid and a cyclohexanedicarboxylic acid.

(Use Method)

The resist composition for immersion exposure of the present invention is used by dissolving the above-described components in a predetermined organic solvent, preferably a mixed solvent described above, and coating the obtained solution on a predetermined support as follows.

That is, the resist composition for immersion exposure is coated on a substrate (e.g., silicon/silicon dioxide-coated substrate) as those used in the production of precision integrated circuit devices, to an arbitrary thickness (usually from 50 to 500 nm) by an appropriate coating method such as spinner or coater.

After the coating, the resist coated is dried by spinning or baking to form a resist film, and the resist film is exposed with intervention of immersion water through a mask for the pattern formation. The exposure is performed, for example, in the state that an immersion liquid is filled between the resist film and the optical lens. The exposure amount can be appropriately selected but is usually from 1 to 100 mJ/cm$^2$. After the exposure, the film is preferably subjected to spinning or drying and then to development and rinsing, whereby a good pattern is obtained. The baking temperature is usually from 30 to 300° C. In view of PED described above, the time from exposure to the baking step is preferably shorter.

The exposure light used here is preferably a far ultraviolet ray at a wavelength of 250 nm or less, more preferably 220 nm or less. Specific examples thereof include KrF excimer laser (248 nm), ArF excimer laser (193 nm), F$_2$ excimer laser (157 nm) and X ray.

The contact of the resist surface with the immersion liquid is considered to bring about the change in the performance, which is observed when the resist is applied to immersion exposure.

The immersion liquid used in the immersion exposure is described below.

The immersion liquid is preferably a liquid transparent to light at the exposure wavelength and having a small temperature constant of refractive index as much as possible so as to minimize the distortion of an optical image projected on the resist. Particularly, when the exposure light source is an ArF excimer laser (wavelength: 193 nm), water is preferably used in view of easy availability and easy handleability, in addition to the above-described aspects.

In the case of using water as the immersion liquid, for the purpose of decreasing the surface tension of water and increasing the surface activity, an additive (liquid) which does not dissolve the resist layer on a wafer and at the same time, gives only a negligible effect on the optical coat on the lower surface of the lens element may be added at a small ratio. The additive is preferably an aliphatic alcohol having a refractive index nearly equal to that of water and specific examples thereof include methyl alcohol, ethyl alcohol and isopropyl alcohol. By adding an alcohol having a refractive index substantially equal to that of water, even when the alcohol component in water is evaporated and the content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

In order to prevent the resist film from directly contacting with the immersion liquid, an immersion liquid sparingly soluble film (hereinafter sometimes referred to as "a topcoat") may be provided between the immersion liquid and the resist film formed from the resist composition for immersion exposure of the present invention. The functions required of the topcoat is suitability for coating on the resist upper layer part, transparency to radiation particularly at 193 nm, and low solubility in the immersion liquid. The topcoat preferably does not intermix with the resist and can be uniformly coated on the resist upper layer.

In view of transparent to light at 193 nm, the topcoat is preferably an aromatic-free polymer and specific examples thereof include a hydrocarbon polymer, an acrylic acid ester polymer, a polymethacrylic acid, a polyacrylic acid, a polyvinyl ether, a silicon-containing polymer and a fluorine-containing polymer.

On peeling off the topcoat, a developer may be used or a releasing agent may be separately used. The releasing agent is preferably a solvent less permeating into the resist. From the standpoint that the peeling step can be performed simultaneously with the resist development step, the topcoat is preferably peelable with an alkali developer and in view of peeling with an alkali developer, the topcoat is preferably acidic, but in view of non-intermixing with the resist, the topcoat may be neutral or may be alkaline.

With no difference in the refractive index between the topcoat and the immersion liquid, the resolving power is enhanced. When the exposure light source is an ArF excimer laser (wavelength: 193 nm), water is preferred as the immersion liquid and therefore, the topcoat for ArF immersion exposure preferably has a refractive index close to the refractive index (1.44) of water. Also, in view of transparency and refractive index, the topcoat is preferably a thin film.

In the development step, the developer is used as follows. The developer which can be used for the resist composition for immersion exposure is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethyl-ethanolamine and triethanolamine, a quaternary ammonium salt such as tetramethylammonium hydroxide and tetraethylammonium hydroxide, or a cyclic amine such as pyrrole and piperidine.

In the alkaline developer, an alcohol and a surfactant maw also be added each in an appropriate amount.

For the rinsing solution, pure water is used and this may be used after adding an appropriate amount of surfactant.

The alkali concentration of the alkali developer is usually from 0.1 to 20 mass %.

The pH of the alkali developer is usually from 10.0 to 15.0.

After the development or rinsing, the developer or rinsing solution adhering on the pattern may removed by a supercritical fluid.

EXAMPLES

The present invention is described in greater detail below by referring to Examples, but the present invention is not limited thereto.

Synthesis Example 1

Synthesis of Resin (21)

A mixture of tert-Bu norbornenecarboxylate, norbornenecarboxylic acid, 2-hydroxyethyl norbornenecarboxylate and maleic anhydride was dissolved in tetrahydrofuran to prepare a solution having a solid content of 50 mass %. This solution was charged into a three-neck flask and heated at 60° C. in a nitrogen stream. When the reaction temperature was stabilized, 50 mol % of a radical initiator V-60 produced by Wako Pure Chemical Industries, Ltd. was added to start the reaction. After heating for 6 hours, the reaction mixture was 2-fold diluted with tetrahydrofuran and then charged into a 5-fold amount of hexane with respect to the reaction solution, thereby precipitating a white powder. This powder was again dissolved in tetrahydrofuran and then charged into a 5-fold amount of hexane with respect to the solution to precipitate a white powder. The precipitated powder was collected by filtration and dried to obtain the objective Resin (21) having the following repeating units.

The molecular weight of Resin (21) obtained was analyzed ($R_1$ analysis) by GPC and found to be 7,900 (weight average) in terms of polystyrene.

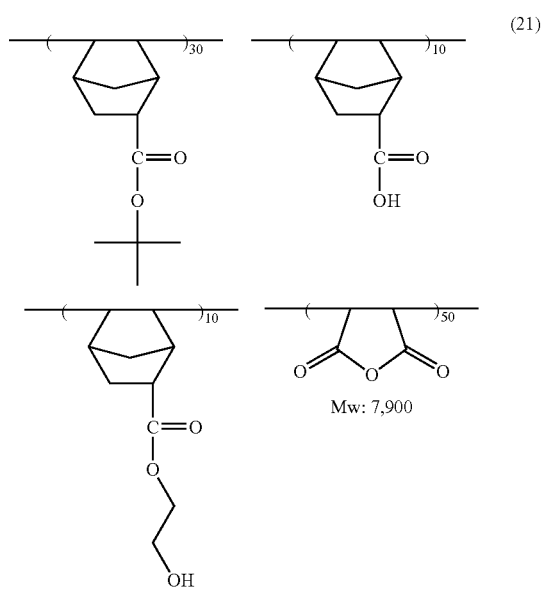

Resins (1) to (20) shown below of the present invention and Resins (22) to (25) shown below of Comparative Examples were obtained in the same manner.

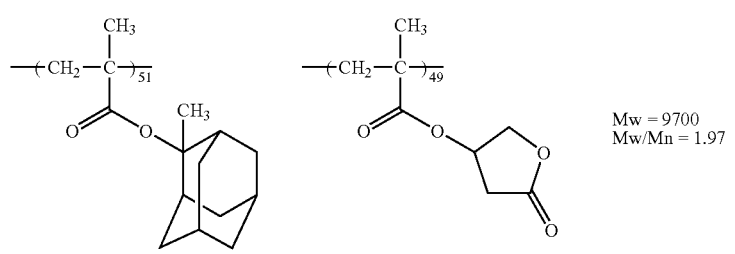

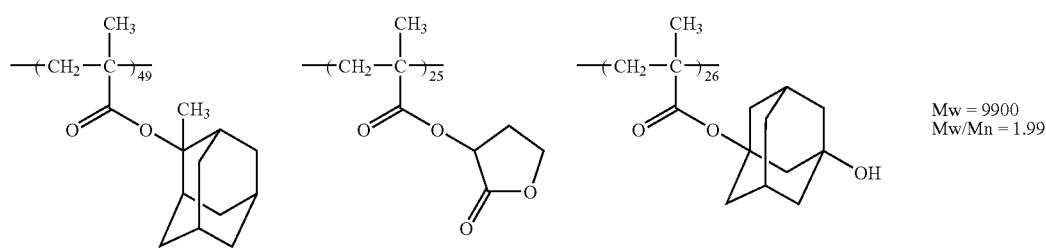

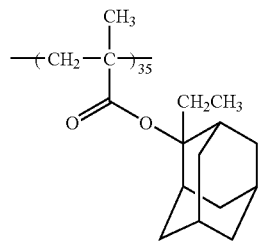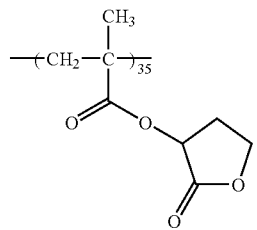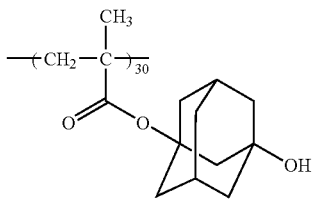
(3) Mw = 9200, Mw/Mn = 2.04
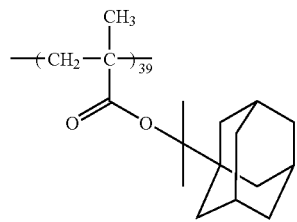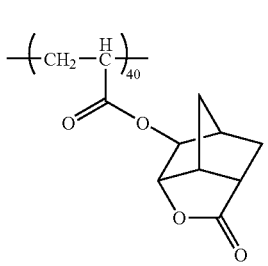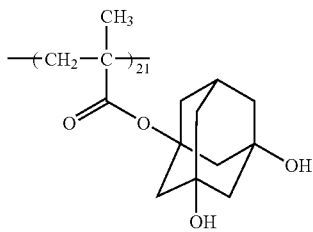
(4) Mw = 9700, Mw/Mn = 2.01
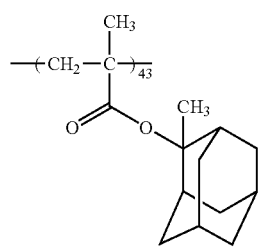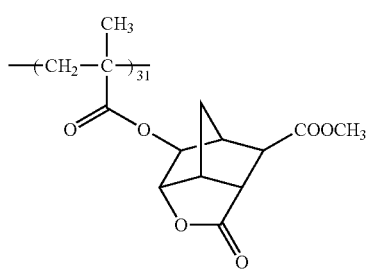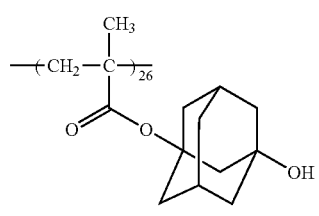
(5) Mw = 8200, Mw/Mn = 1.91
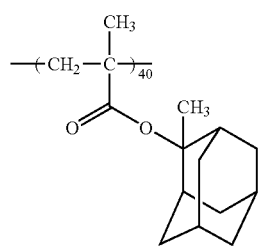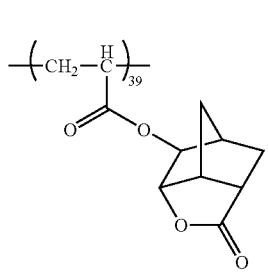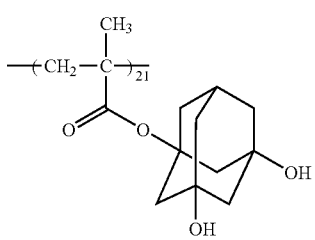
(6) Mw = 9500, Mw/Mn = 2.07
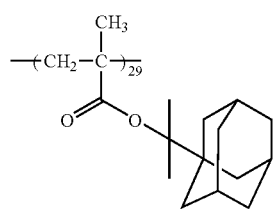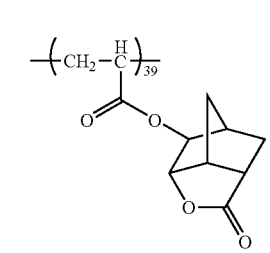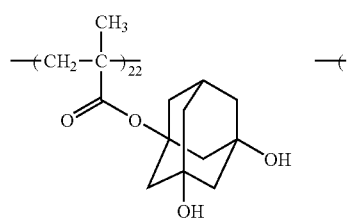
(7) Mw = 8700, Mw/Mn = 1.98
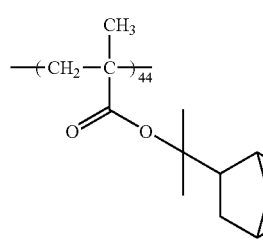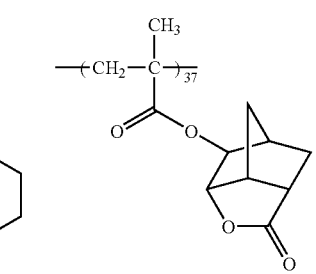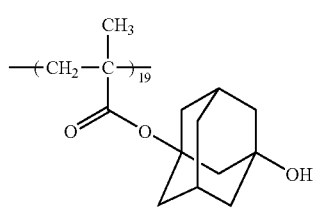
(8) Mw = 10300, Mw/Mn = 2.16

-continued
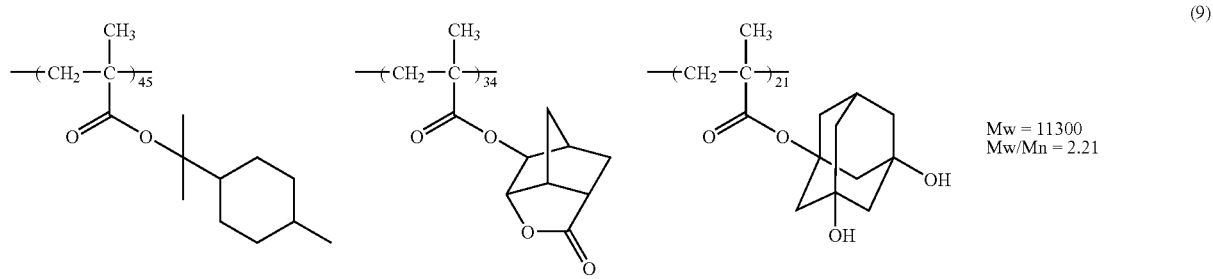
(9)
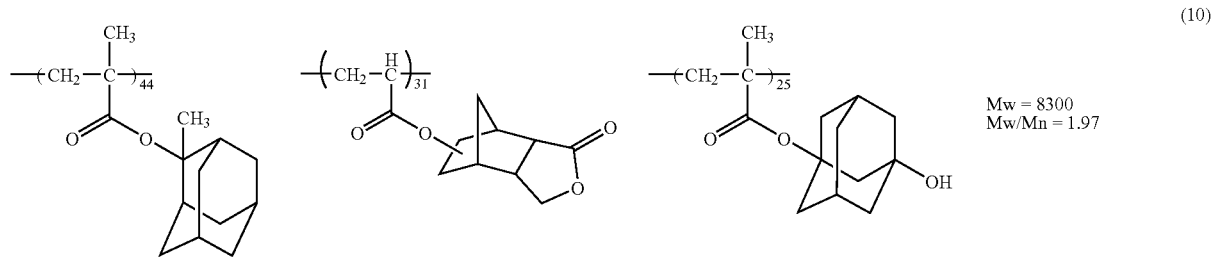
(10)
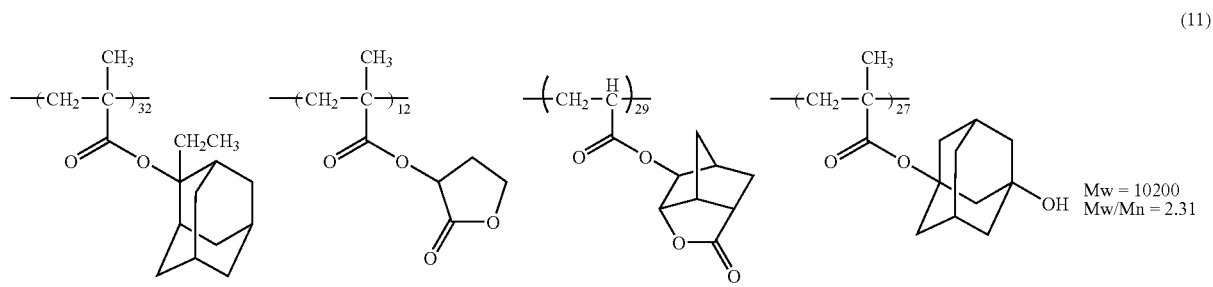
(11)
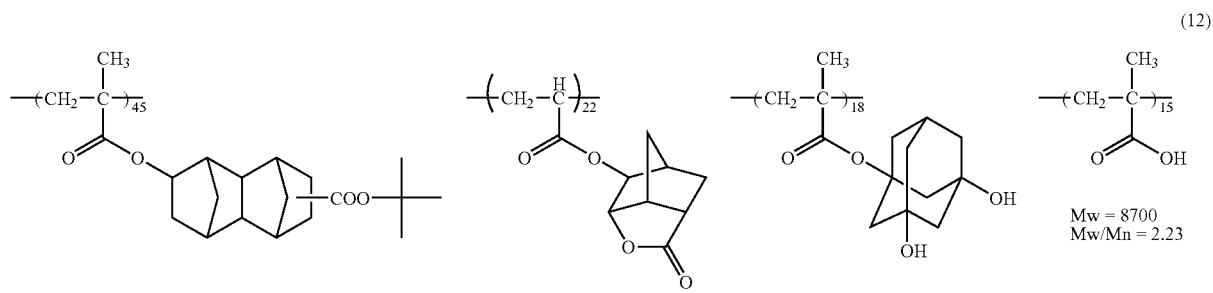
(12)
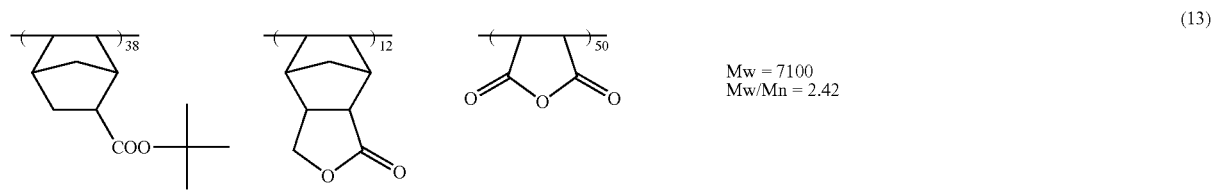
(13)
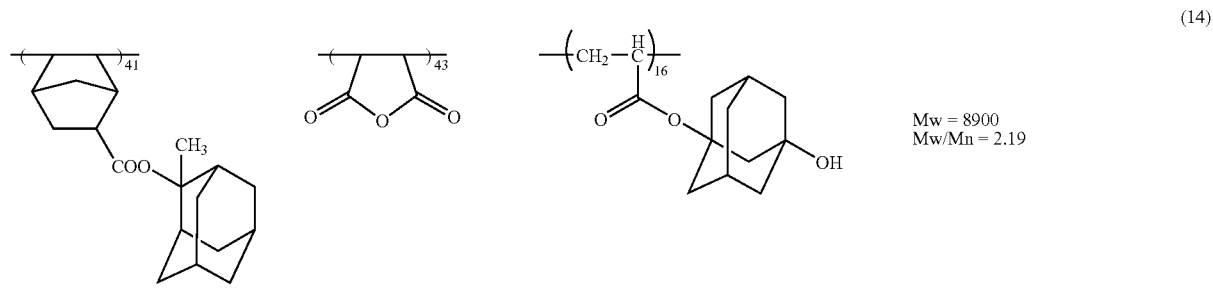
(14)

-continued
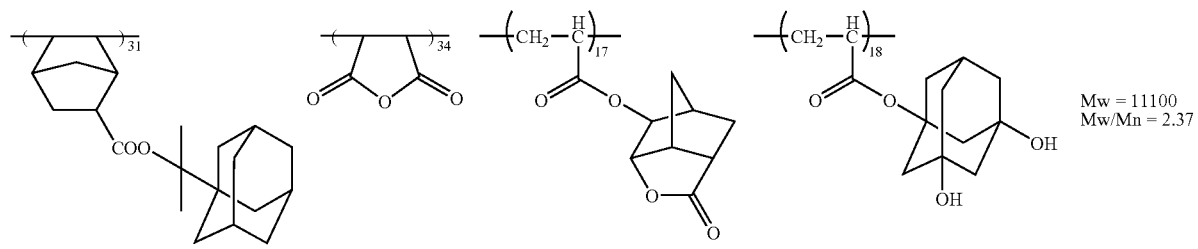
(15)
Mw = 11100
Mw/Mn = 2.37
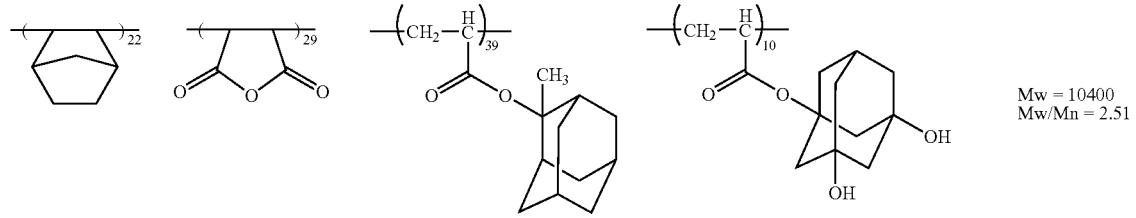
(16)
Mw = 10400
Mw/Mn = 2.51
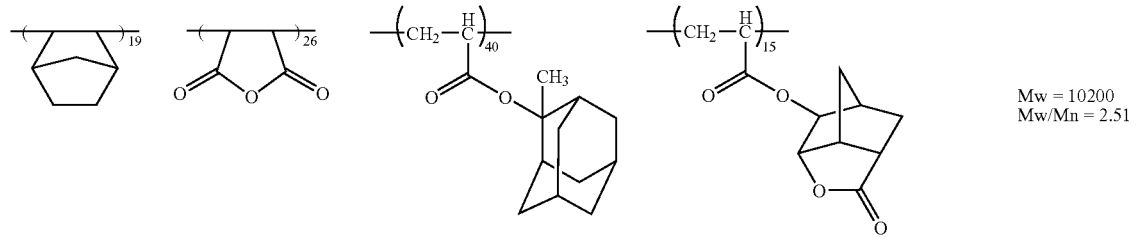
(17)
Mw = 10200
Mw/Mn = 2.51
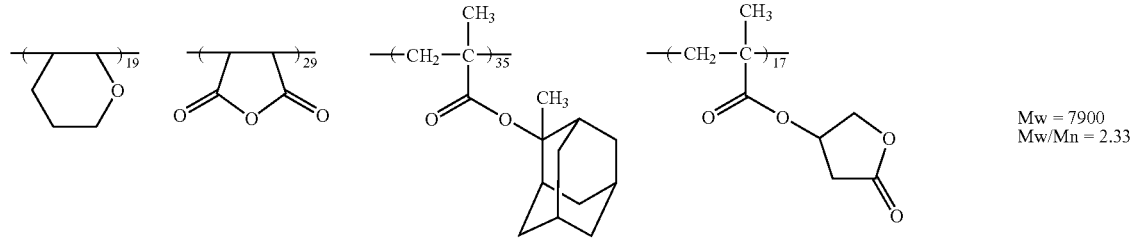
(18)
Mw = 7900
Mw/Mn = 2.33
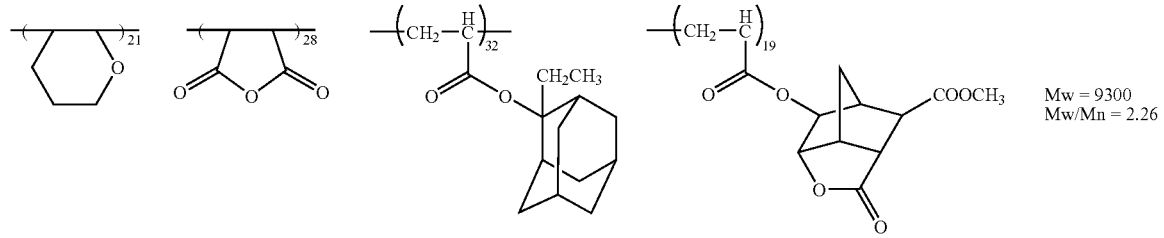
(19)
Mw = 9300
Mw/Mn = 2.26
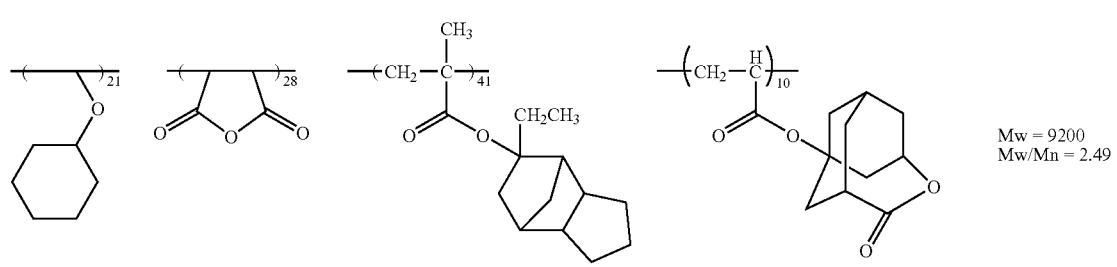
(20)
Mw = 9200
Mw/Mn = 2.49

-continued

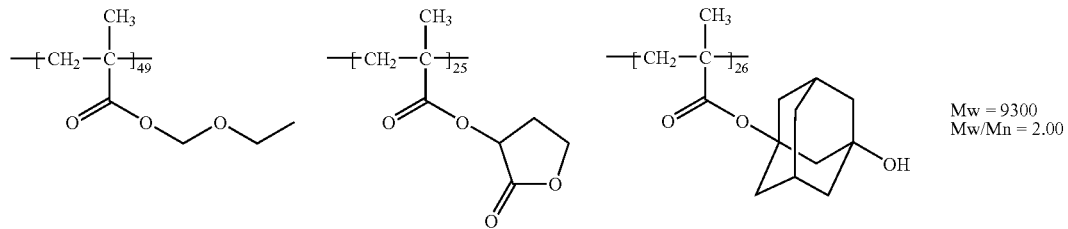

(22)

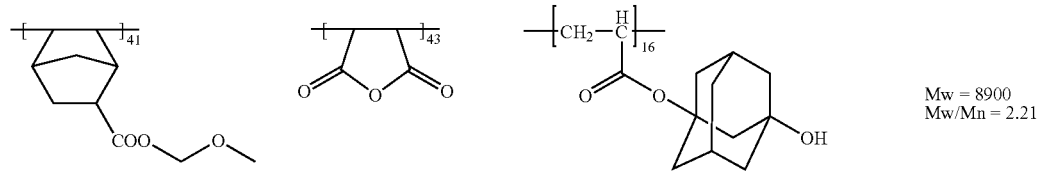

(23)

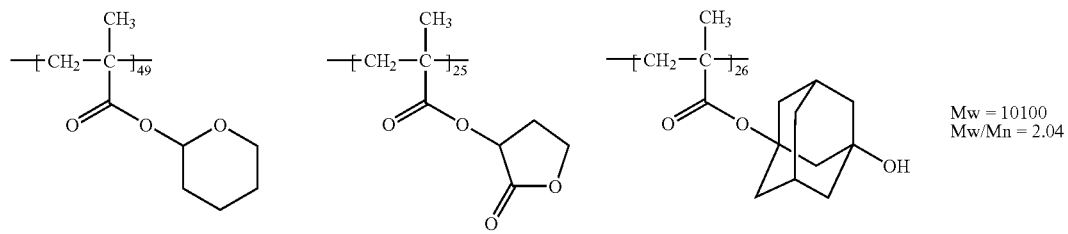

(24)

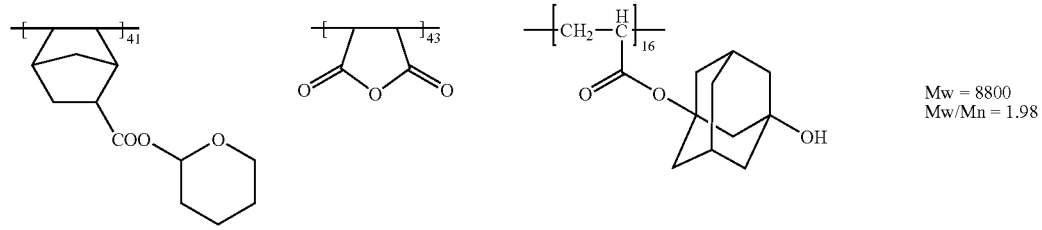

(25)

Examples 1 to 22 and Comparative Examples 1 to 4

<Preparation of Resist>

The components shown in Table 1 below were dissolved in a solvent to prepare a solution having a solid concentration of 7.5 mass %, and this solution was filtered through a 0.1-μm polyethylene filter to prepare a positive resist composition for immersion exposure. The prepared positive resist composition for immersion exposure was evaluated by the following methods and the results are shown in Table 1. As for each component, when a plurality of components are used, the ratio is by mass.

<Performance Test>

Comparison of performance when water treatment was applied before and after exposure with performance when not applied.

[Exposure Condition 1: Evaluation of Exposure when Water Treatment was not Applied Before and after Exposure (Normal Exposure Condition)]

An organic antireflective film ARC29A (produced by Brewer Science, Inc.) was coated on a silicon wafer and then baked at 205° C. for 60 seconds to form a 78 nm-thick antireflective film.

On this antireflective film, the resist composition prepared above was coated and baked at 115° C. for 60 seconds to form a 200 nm-thick resist film. The obtained wafer was subjected to pattern exposure by using an ArF excimer laser scanner (PAS5500/1100, manufactured by ASLM, NA: 0.75, σo/σi: 0.85/0.55) through a halftone phase-shift mask having a transmittance of 6%.

Thereafter, the resist film was heated at 120° C. for 60 seconds, developed with an aqueous tetramethylammonium hydroxide solution (2.38%) for 30 seconds, rinsed with pure water and then spin-dried to obtain a resist pattern.

[Exposure Condition 2: Evaluation of Exposure when Water Treatment was Applied Before and After Exposure]

An organic antireflective film ARC29A (produced by Brewer Science, Inc.) was coated on a silicon wafer and then baked at 205° C. for 60 seconds to form a 78 nm-thick antireflective film.

On this antireflective film, the resist composition prepared above was coated and baked at 115° C. for 60 seconds to form a 200 nm-thick resist film. The obtained wafer was treated with pure water under paddling for 60 seconds and then subjected to pattern exposure by using an ArF excimer laser scanner (PAS5500/1100, manufactured by ASLM, NA: 0.75, σo/σi: 0.85/0.55) through a halftone phase-shift mask having a transmittance of 6%. The pure water treatment was applied also immediately after exposure.

Thereafter, the resist film was heated at 120° C. for 60 seconds, developed with an aqueous tetramethylammonium hydroxide solution (2.38%) for 30 seconds, rinsed with pure water and then spin-dried to obtain a resist pattern.

[Conditions for Evaluation of DOF and Profile]

The resist pattern used for evaluation was a crowded pattern having a 90-nm line and a space at a ratio of 1:1. From the observation through a length-measuring scanning electron microscope (S-9260, manufactured by Hitachi Ltd.), the exposure amount (Eopt) of reproducing the above-described mask size was determined and also, the range of the depth of focus (DOF) capable of reproduction to 90 nm±10% at the Eopt was measured and used as the DOF value.

At this time, the DOF value determined for Exposure Condition 1 was denoted as $DOF_1$ and the DOF value determined for Exposure Condition 2 was denoted as $DOF_2$ to define the ratio $DOF_2/DOF_1$ of $DOF_2$ to $DOF_1$. As this ratio is closer to 1, the immersion exposure resistance is higher, and as the ratio is smaller than 1, the immersion exposure resistance is lower.

Furthermore, the cross-sectional shape of the line pattern at Eopt was observed by a scanning electron microscope (S-4300, manufactured by Hitachi, Ltd.) and the side wall angle was measured. At this time, the side wall angle determined for Exposure Condition 1 was denoted as $D_1$ and the side wall angle determined for Exposure Condition 2 was denoted as $D_2$ to define the ratio $D_2/D_1$ of $D_2$ to $D_1$. As this ratio is closer to 1, the immersion exposure resistance is higher, and as the ratio is smaller than 1, the immersion exposure resistance is lower.

TABLE 1

| | Resin (2 g) | Photoacid Generator | Solvent (mass ratio) | | | Basic Compound | Surfactant (5 mg) | $DOF_2/DOF_1$ | $D_2/D_1$ |
| | | | Alkylene glycol alkyl ether carboxylate | PGME | Other | | | | |
| --- | --- | --- | --- | --- | --- | --- | --- | --- | --- |
| Example 1 | 2 | Z2 (0.06 g) | SL-4 (40) | (60) | — | N-1 (4 mg) | W-2 | 1.00 | 1.0 |
| Example 2 | 3 | Z2 (0.06 g) | SL-4 (40) | (60) | — | N-2 (4 mg) | W-2 | 0.90 | 0.98 |
| Example 3 | 3 | Z2 (0.06 g) | SL-4 (50) | (50) | — | N-3 (4 mg) | W-2 | 0.95 | 0.95 |
| Example 4 | 3 | Z2 (0.06 g) | SL-4 (70) | (30) | — | N-5 (4 mg) | W-2 | 0.95 | 0.99 |
| Example 5 | 3 | Z2 (0.06 g) | SL-4 (76) | (19) | SL-8 (5) | N-2 (4 mg) | W-2 | 1.00 | 1.0 |
| Example 6 | 3 | Z2 (0.06 g) | SL-4 (90) | (10) | — | N-1 (2 mg) + N-3 (2 mg) | W-2 | 1.00 | 1.0 |
| Example 7 | 3 | Z2 (0.03 g) + Z49 (0.06 g) | SL-4 (63) | (27) | SL-7 (10) | N-1 (4 mg) | W-2 | 1.00 | 0.97 |
| Example 8 | 5 | Z14 (0.06 g) | SL-4 (80) | (20) | | N-3 (2 mg) + N-6 (2 mg) | W-2 | 0.9 | 0.96 |
| Example 9 | 6 | Z13 (0.06 g) | SL-4 (50) | (50) | — | N-2 (4 mg) | W-2 | 0.95 | 1.0 |
| Example 10 | 7 | Z55 (0.06 g) | SL-4 (76) | (19) | SL-9 (5) | N-3 (4 mg) | W-2 | 1.00 | 0.98 |
| Example 11 | 7 | Z14 (0.03 g) + Z55 (0.25 g) | SL-4 (70) | (30) | — | N-3 (4 mg) | W-2 | 1.00 | 0.98 |
| Example 12 | 8 | Z14 (0.06 g) | SL-4 (70) | (30) | — | N-1 (4 mg) | W-3 | 1.00 | 0.97 |
| Example 13 | 9 | Z2 (0.06 g) | SL-4 (60) | (40) | — | N-1 (4 mg) | W-4 | 1.00 | 1.0 |
| Example 14 | 10 | Z44 (0.1 g) | SL-4 (90) | (10) | — | N-6 (4 mg) | W-4 | 0.90 | 1.0 |
| Example 15 | 11 | Z2 (0.06 g) | SL-4 (40) | (60) | — | N-1 (4 mg) | W-1 | 0.95 | 0.96 |
| Example 16 | 12 | Z2 (0.06 g) | SL-4 (70) | (30) | — | N-4 (2 mg) + N-6 (2 mg) | W-3 | 0.95 | 0.95 |
| Example 17 | 13 | Z2 (0.06 g) | SL-4 (45) | (45) | SL-5 (10) | N-3 (4 mg) | W-2 | 0.95 | 0.98 |
| Example 18 | 14 | Z2 (0.06 g) | SL-4 (57) | (38) | SL-2 (5) | N-3 (4 mg) | W-2 | 1.00 | 0.97 |
| Example 19 | 15 | Z2 (0.06 g) | SL-4 (70) | (30) | — | N-4 (2 mg) + N-6 (2 mg) | W-1 | 0.90 | 1.0 |
| Example 20 | 16 | Z2 (0.06 g) | SL-4 (40) | (60) | — | N-6 (4 mg) | W-1 | 0.90 | 1.0 |
| Example 21 | 17 | Z2 (0.06 g) | SL-4 (76) | (19) | SL-1 (5) | N-3 (4 mg) | W-4 | 0.95 | 0.98 |
| Example 22 | 18 | Z2 (0.06 g) | SL-4 (45) | (45) | SL-3 (10) | N-6 (4 mg) | W-4 | 1.00 | 0.96 |
| Example 23 | 19 | Z3 (0.06 g) | SL-4 (70) | (30) | — | N-1 (4 mg) | W-3 | 1.00 | 0.97 |
| Example 24 | 20 | Z6 (0.06 g) | SL-4 (57) | (38) | SL-2 (5) | N-3 (4 mg) | W-4 | 0.95 | 0.96 |
| Example 25 | 21 | Z11 (0.06 g) | SL-4 (40) | (60) | — | N-6 (4 mg) | W-3 | 0.95 | 0.98 |
| Example 26 | 22 | Z15 (0.06 g) | SL-4 (45) | (45) | SL-5 (10) | N-4 (2 mg) + N-6 (2 mg) | W-4 | 1.00 | 1.0 |
| Example 27 | 23 | Z44 (0.06 g) | SL-4 (40) | (60) | — | N-3 (4 mg) | W-4 | 1.00 | 1.0 |
| Example 28 | 24 | Z2 (0.06 g) | SL-4 (70) | (30) | — | N-5 (4 mg) | W-4 | 0.95 | 1.0 |
| Example 29 | 3 | Z2 (0.06 g) | SL-10 (50) | (50) | — | N-2 (4 mg) | W-2 | 1.0 | 1.0 |
| Example 30 | 24 | Z2 (0.06 g) | SL-11 (80) | (20) | — | N-1 (4 mg) | W-1 | 0.95 | 1.0 |
| Example 31 | 24 | Z2 (0.06 g) | SL-12 (85) | (15) | — | N-1 (4 mg) | W-2 | 1.0 | 0.97 |
| Example 32 | 24 | Z2 (0.06 g) | SL-13 (70) | (30) | — | N-1 (4 mg) | W-4 | 1.0 | 0.98 |
| Example 33 | 24 | Z2 (0.06 g) | SL-14 (65) | (35) | — | N-2 (4 mg) | W-3 | 0.95 | 1.0 |

TABLE 1-continued

| | Resin (2 g) | Photoacid Generator | Solvent (mass ratio) | | | | Surfactant (5 mg) | DOF$_2$/DOF$_1$ | D$_2$/D$_1$ |
| | | | Alkylene glycol alkyl ether carboxylate | PGME | Other | Basic Compound | | | |
|---|---|---|---|---|---|---|---|---|---|
| Example 34 | 3 | Z2 (0.06 g) | SL-4 (35) | (65) | — | N-1 (4 mg) | W-2 | 0.429 | 0.80 |
| Example 35 | 3 | Z2 (0.06 g) | SL-4 (95) | (5) | — | N-1 (4 mg) | W-2 | 0.500 | 0.75 |
| Comparative Example 1 | 3 | Z2 (0.06 g) | SL-4 (100) | | — | N-3 (4 mg) | W-2 | 0.310 | 0.52 |

Abbreviations in the Table are as follows. The photoacid generators correspond to the compounds exemplified above.
W-1: Megafac F176 (produced by Dainippon Ink & Chemicals, Inc.) (fluorine-containing surfactant)
W-2: Megafac R08 (produced by Dainippon Ink & Chemicals, Inc.) (fluorine/silicon-containing surfactant)
W-3: polysiloxane polymer KP-341 (produced by Shin-Etsu Chemical Co., Ltd.) (silicon-containing surfactant)
W-4: Troysol S-366 (produced by Troy Chemical)
SL-1: cyclopentanone
SL-2: cyclohexanone
SL-3: 2-methylcyclohexanone
SL-4: propylene glycol monomethyl ether acetate
SL-5: ethyl lactate
SL-7: 2-heptanone
SL-8: γ-butyrolactone
SL-9: propylene carbonate
SL-10: propylene glycol monoethyl ether acetate
SL-11: propylene glycol monobutyl ether acetate
SL-12: propylene glycol monopropyl ether acetate
SL-13: ethylene glycol monopropyl ether acetate
SL-14: ethylene glycol monoethyl ether acetate
N-1: N,N-dibutylaniline
N-2: N,N-dipropylaniline
N-3: N,N-dihydroxyethylaniline
N-4: 2,4,5-triphenylimidazole
N-5: 2,6-diisopropylaniline
N-6: hydroxyantipyrine As seen from these results, even when the positive resist composition for immersion exposure of the present invention is applied to immersion exposure, the DOF and profile properties are not deteriorated. Also, a positive resist composition for immersion exposure having excellent followability to the immersion liquid can be provided.

According to the present invention, a resist composition for immersion exposure, which can ensure, even when used for immersion exposure, excellent line edge roughness, no pattern collapse, wide exposure latitude and high followability to immersion liquid can be obtained. By this composition, an excellent pattern lessened in the bad effect even when performing immersion exposure can be formed.

The entire disclosure of each and every foreign patent application from which the benefit of foreign priority has been claimed in the present application is incorporated herein by reference, as if fully set forth.

What is claimed is:

1. A pattern formation method comprising:
    providing a resist composition for immersion, comprising:
        (A) a resin of which solubility in an alkali developer increases under an action of an acid;
        (B) a photoacid generator; and
        (C) a mixed solvent containing an alkylene glycol alkyl ether carboxylate and a propylene glycol monomethyl ether;
    coating the resist composition on a substrate to form a resist film; and
    immersion exposing the resist film,
    wherein the resin (A) comprises a repeating unit represented by the following formula (AII):

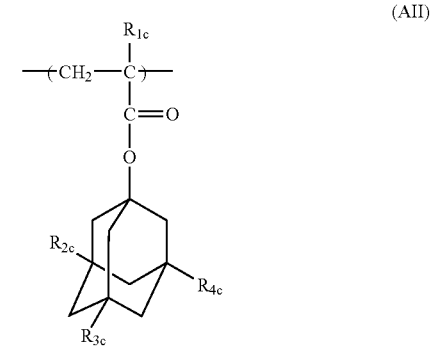

wherein $R_{1c}$ represents a hydrogen atom or a methyl group, and $R_{2c}$ to $R_{4c}$ each independently represents a hydrogen atom or a hydroxyl group, provided that at least two of $R_{2c}$ to $R_{4c}$ represent a hydroxyl group.

2. The pattern formation method according to claim 1, wherein an immersion liquid used in the immersion exposing comprises water.

3. The pattern formation method according to claim 1, wherein a mixing ratio by mass of the mixed solvent (C) is alkylene glycol alkyl ether carboxylate/propylene glycol monomethyl ether=4/6 to 9/1.

4. The pattern formation method according to claim 1, wherein a mixing ratio by mass of the mixed solvent (C) is alkylene glycol alkyl ether carboxylate/propylene glycol monomethyl ether=4.5/5.5 to 8.5/1.5.

5. The pattern formation method according to claim 1, wherein a mixing ratio by mass of the mixed solvent (C) is alkylene glycol alkyl ether carboxylate/propylene glycol monomethyl ether=5/5 to 8/2.

6. The pattern formation method according to claim 1, wherein a mixing ratio by mass of the mixed solvent (C) is alkylene glycol alkyl ether carboxylate/propylene glycol monomethyl ether=6/4 to 7.5/2.5.

7. The pattern formation method according to claim 1, wherein the resist composition further comprises (E) a surfactant.

8. The pattern formation method according to claim 7, wherein the surfactant comprises at least one of: a fluorine-containing surfactant; a silicon-containing surfactant; and a fluorine/silicon-containing surfactant.

9. A pattern formation method comprising:
providing a resist composition for immersion, comprising:
  (A) a resin of which solubility in an alkali developer increases under an action of an acid;
  (B) a photoacid generator; and
  (C) a mixed solvent containing an alkylene glycol alkyl ether carboxylate and a propylene glycol monomethyl ether;
coating the resist composition on a substrate to form a resist film; and
immersion exposing the resist film,
wherein the immersion liquid used in the immersion exposure comprises water and an aliphatic alcohol having a refractive index substantially equal to that of water.

* * * * *